United States Patent [19]
Asami et al.

[11] Patent Number: 5,391,904
[45] Date of Patent: Feb. 21, 1995

[54] SEMICONDUCTOR DELAY CIRCUIT DEVICE

[75] Inventors: Fumitaka Asami, Kunitachi; Shinya Udo, Kawasaki, both of Japan

[73] Assignees: Fujitsu Limited, Kawasaki; Kyushu Fujitsu Electronics Limited, Satsuma, both of Japan

[21] Appl. No.: 80,651

[22] Filed: Jun. 22, 1993

Related U.S. Application Data

[63] Continuation of Ser. No. 722,353, Jun. 18, 1991, abandoned, which is a continuation of Ser. No. 400,909, Aug. 30, 1989, abandoned.

[30] Foreign Application Priority Data

Sep. 1, 1988 [JP] Japan ............................ 63-216387
Sep. 1, 1988 [JP] Japan ............................ 63-216388
Sep. 1, 1988 [JP] Japan ............................ 63-216389

[51] Int. Cl.⁶ .................. H01L 29/76; H01L 29/94; H01L 31/062; H01L 23/48
[52] U.S. Cl. .................. 257/369; 257/390; 257/401; 257/734; 257/773
[58] Field of Search ............ 357/42, 23.12, 48, 50; 257/369, 390, 401, 773, 734, 544, 42; 307/606

[56] References Cited

U.S. PATENT DOCUMENTS

| | | | |
|---|---|---|---|
| 4,695,866 | 9/1987 | Koyabu | 357/42 |
| 4,737,831 | 4/1988 | Iwai | 357/55 |
| 4,742,254 | 3/1988 | Tamisawa | 357/42 |
| 4,893,164 | 1/1990 | Shirato | 357/48 |
| 4,942,448 | 7/1990 | Tsukamoto et al. | 357/42 |
| 5,023,688 | 6/1991 | Ando et al. | 357/42 |

FOREIGN PATENT DOCUMENTS

| | | | |
|---|---|---|---|
| 54-32082 | 9/1979 | Japan | 357/42 |
| 55-52266 | 4/1980 | Japan | 357/42 |
| 58-116763 | 7/1983 | Japan | 257/369 |
| 59-158546 | 9/1984 | Japan | 257/390 |
| 59-165448 | 9/1984 | Japan | 357/42 |
| 60-64473 | 4/1985 | Japan | 357/48 |
| 60-123053 | 7/1985 | Japan | 357/42 |
| 60-154553 | 8/1985 | Japan | 357/42 |
| 62-247619 | 10/1987 | Japan | 257/369 |

OTHER PUBLICATIONS

IBM Technical Disclosure Bulletin, vol. 28, No. 11 Apr. 1986, "Source/Drain Personalization of High Density CMOS Read-Only Store", p. 4872.

*Primary Examiner*—Steven Ho Yin Loke
*Attorney, Agent, or Firm*—Armstrong, Westerman, Hattori, McLeland & Naughton

[57] ABSTRACT

A semiconductor delay circuit device comprises a pair of transistors of the same conduction type having source regions that are arranged adjacent to each other and facing each other, and a substrate contact diffusion region whose conduction type is opposite to that of the source regions. The substrate contact diffusion region extends between the source regions. Therefore, the source regions of the transistors do not influence each other.

19 Claims, 25 Drawing Sheets

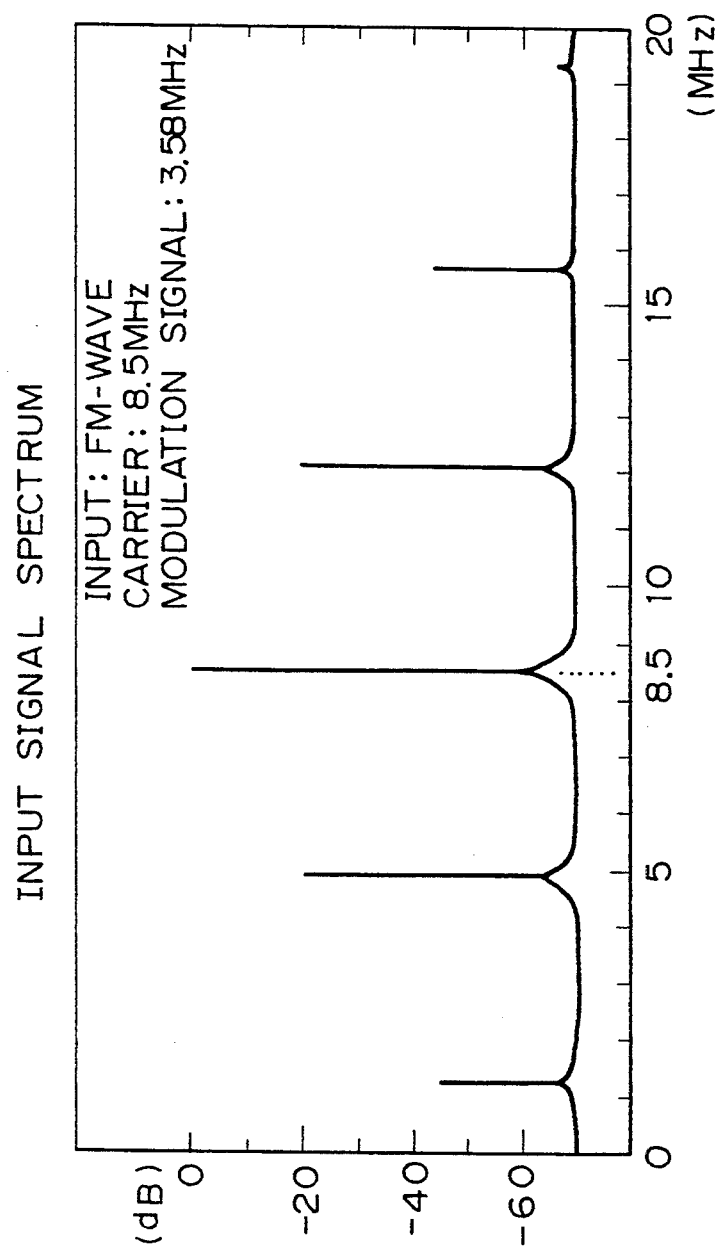

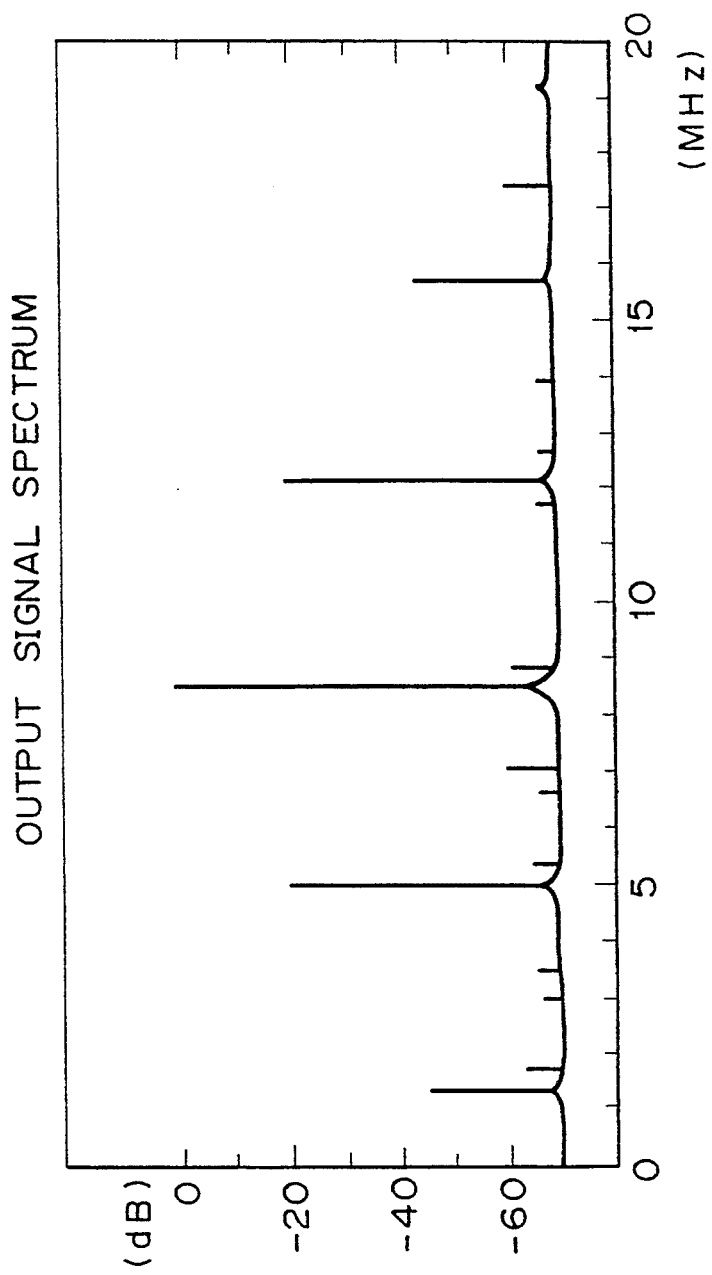

SEMICONDUCTOR DELAY CIRCUIT DEVICE

This application is a continuation of application Ser. No. 07/722,353, filed Jun. 18, 1991, now abandoned, which in turn is a continuation of application Ser. No. 07/400,909, filed Aug. 30, 1989, now abandoned.

BACKGROUND OF THE INVENTION

1. Field of the Invention

The present invention relates to a semiconductor integrated circuit device, more particularly, to a semiconductor delay circuit device having a plurality of inverter circuits which are cascade-connected.

2. Description of the Related Art

A semiconductor delay circuit device is used for an optical disc system, for example, a laser disc system or a compact disc system. The semiconductor delay circuit device is used for delaying a detected signal of the optical disc system to maintain synchronization even if the center position of the optical disc is shifted. Namely, since the center position of an optical disc cannot be formed perfectly at the exact center of the disc in a production step, a semiconductor delay circuit device should be provided in the optical disc system for synchronization. Note, the semiconductor delay circuit device is, for example constituted by a plurality of inverter circuits which are cascade-connected, and an input signal of the semiconductor delay circuit device is delayed in accordance with a value of a power supply voltage applied to the plurality of inverter circuits in the semiconductor delay circuit device.

Recently, the layout pattern of prior semiconductor delay circuit devices tends to be increasingly miniaturized by a requirement of large scale integration, and thus, inverter circuits are arranged adjacent to one another. The same conduction type (P-channel type or N-channel type) transistors of the plurality of inverter circuits in the semiconductor delay circuit device are then arranged such that their source regions are integrally formed with each other to constitute a common source region. In this case, a substrate contact diffusion region, which is an N+ layer or P+ layer that is an opposite conduction type relative to the common source region and has a higher impurity density than a substrate, is arranged for the common source region separately from the common source region. The common source region and substrate contact diffusion region are connected to power sources through aluminum wirings.

However, when a specific transistor is operating with the above arrangement, an operation current of the transistor flows to an aluminum wiring through the common source region, that is, the operation current of the transistor does not flow only through a source region, which is the common source region, of the specific transistor, but also flows through a source region, which is also the common source region, of a transistor neighboring the specific transistor. Then, due to contact resistance between the common source region and the aluminum wiring, etc., source potentials of the specific and neighboring transistors which have the common source region may be influenced by each other.

Further, in the layout pattern of the prior semiconductor delay circuit device, lines that connect the respective source and drain regions of the P-channel type and N-channel type transistors run in parallel with each other, and a polysilicon layer constituting a gate electrode and an aluminum wiring for connecting the drain region of the respective transistor are constituted by combining linear portions. Therefore, a pattern forming a single inverter circuit may have many useless portions marking the overall pattern larger. Additionally, in the layout pattern of the prior semiconductor delay circuit device, as the number of turning rows increases, the duty ratio of an output waveform gradually changes from the duty ratio of a first input waveform. These problems in the prior semiconductor delay circuit device will be described latest in detail with reference to the accompanying drawings.

SUMMARY OF THE INVENTION

It is an object of the present invention to provide a semiconductor integrated circuit device having an effect where operation current flowing to one transistor never influences a source potential of another transistor adjacent to and facing the first transistor. Further, it is another object of the present invention to provide a semiconductor integrated circuit device having a miniaturized pattern and a reduced layout area made as small as possible. Additionally, is is still another object of the present invention to provide a semiconductor integrated circuit device having an output waveform duty ratio equal to that of a first input waveform.

According to the present invention, there is provided a semiconductor integrated circuit device comprising a pair of transistors of the same conduction type having source regions receiving a common power supply voltage, the source regions being arranged adjacent to each other and facing each other; and a substrate contact diffusion region whose conduction type is opposite to that of the source regions, the substrate contact diffusion region extending between the source regions. Therefore, the source regions do not influence each other.

The semiconductor integrated circuit device may comprise a plurality of pairs of the same conduction type transistors. A substrate contact diffusion region may extend to respective source regions of the pairs of transistors in adjacent stages and protruding to approach channel forming regions of the transistors having the respective source regions.

Further, according to the present invention, there is also provided a semiconductor integrated circuit device comprising a first power supply line, a second power supply line, and a plurality of inverter circuits. The inverter circuits are cascade-connected and each of the inverter circuits is connected to the first and second power supply lines. Each of the inverter circuits is constituted by a first conduction type transistor and a second conduction type transistor. A pair of transistors of the same conduction type has source regions that are arranged adjacent to each other and facing each other. The conduction type of the substrate contact diffusion region is opposite to that of the source regions and which has higher impurity density than the substrate.

The substrate contact diffusion region may have a higher impurity density than the substrate. The first conduction type transistor may be a P-channel type transistor and the second conduction type transistor may be an N-channel type transistor, and the first power supply line may be used for applying a high potential power supply to a source region of each P-channel type transistor of the inverter circuits and the second power supply line may be used for applying a low potential power supply to a source region of each N-channel type transistor of the inverter circuits.

The substrate contact diffusion region between the source regions of the pair of transistors may include a contact portion for connecting aluminum wiring. The distance of the substrate contact diffusion region between the source regions of the pair of transistors may be less than the minimum width of diffusion. The distance of the substrate contact diffusion region between the source regions of the pair of transistors may be less than 4 microns.

The plurality of inverter circuits may be arranged in plural rows, sequentially turned an even number of times and cascade-connected, the number of stages of the inverter circuits in each row may be odd. The number of stages of the inverter circuits in the last row may be even. An ON resistance value of the first conduction type transistor may differ from that of the second conduction type transistor.

Additionally, according to the present invention, there is also provided a semiconductor integrated circuit device comprising a first power supply line, a second power supply line, and a plurality of inverter circuits. The inverter circuits are cascade-connected and each of the inverter circuits is connected to the first and second power supply lines, and each of the inverter circuits is constituted by a first conduction type transistor and a second conduction type transistor.

Source and drain regions of the first and second conduction type transistors are arranged so that extensions of lines connecting the respective source and drain regions of the first and second conduction type transistors intersect each other, and a conductive layer having gate electrodes is disposed orthogonal to the source and drain regions.

A plan shape of a wiring contact provided for each of the source and drain regions of the first and second conduction type transistors may be hexagonal. The wiring for connecting the drain regions of the first and second conduction type transistors with each other may be curved opposite to a curve of the conductive layer having the gate electrodes of the first and second conduction type transactors. The wiring for connecting the drain regions of the first and second conduction type transistors with each other may be connected to a conductive layer having respective gate electrodes of an inverter circuit of the next stage.

BRIEF DESCRIPTION OF THE DRAWINGS

The present invention will be more clearly understood from the description of the preferred embodiments as set forth below with reference to the accompanying drawings, wherein:

FIG. 20a is a graph showing a spectrum of an input waveform of a semiconductor delay circuit device;

FIG. 20c is a graph showing a spectrum of an output waveform of a semiconductor delay circuit device according to the present invention;

DESCRIPTION OF THE PREFERRED EMBODIMENTS

For a better understanding of the preferred embodiments of the present invention, the problems of the related art will be explained first.

Figure 1:
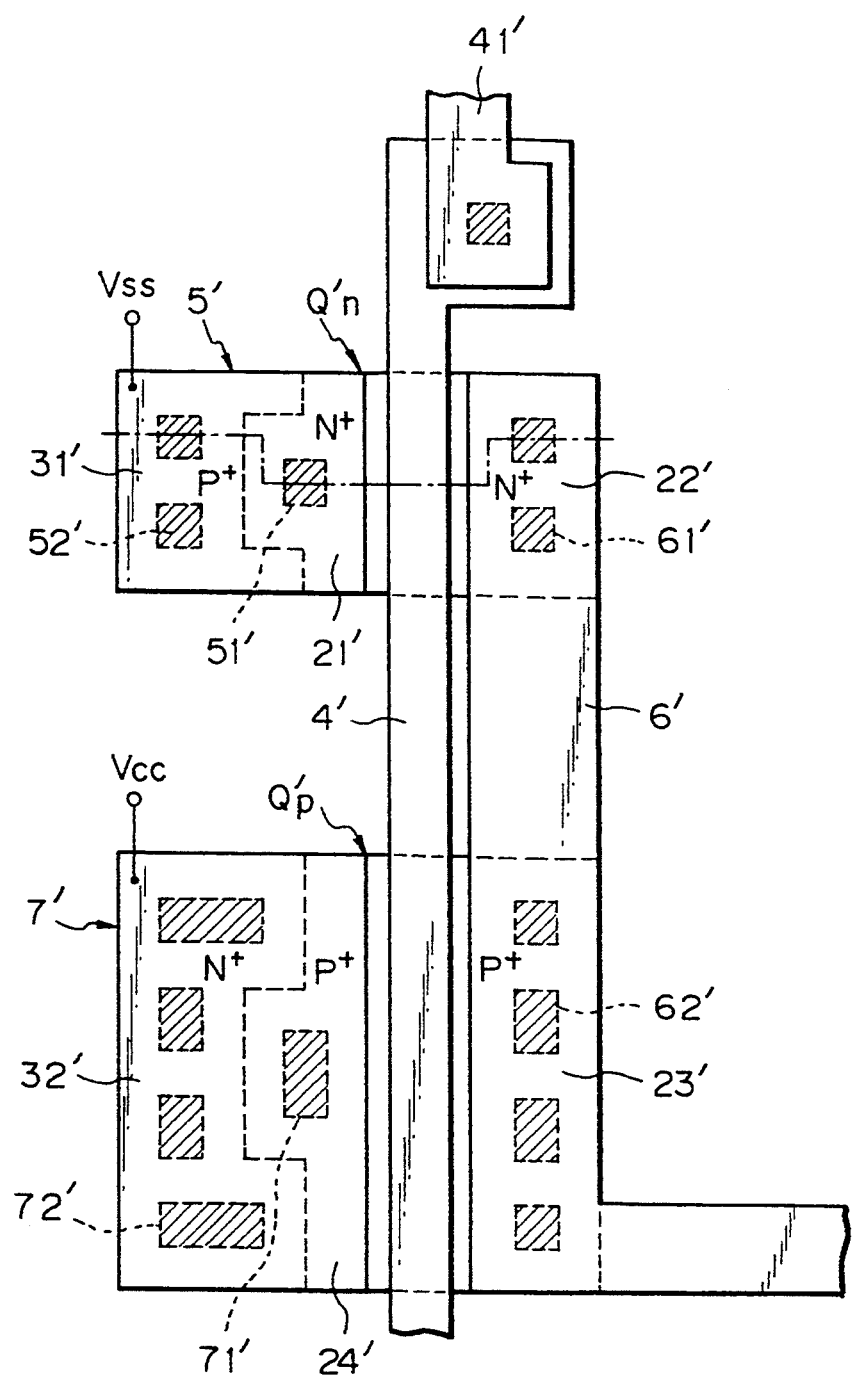
FIG. 1 is a plan view showing a layout of a single inverter portion of a prior art semiconductor delay circuit device.

FIG. 1 is a plan view showing a layout of a single inverter portion of a semiconductor delay circuit device according to a prior art. The semiconductor delay circuit device is used for an optical disc system, and is used for delaying a detected signal of the optical disc system to maintain synchronization, even if a center position of the optical disc is shifted. Namely, since the center position of the optical disc cannot be formed perfectly at the exact center of the disc in a production step, a semiconductor delay circuit device should be provided in the optical disc system for synchronization. It is noted that the semiconductor delay circuit device is, for example, constituted by a plurality of inverter circuits which are cascade-connected, and an input signal of the semiconductor delay circuit device is delayed in accordance with a value of a power supply voltage applied to the plurality of inverter circuits in the semiconductor delay circuit device.

Figure 2:
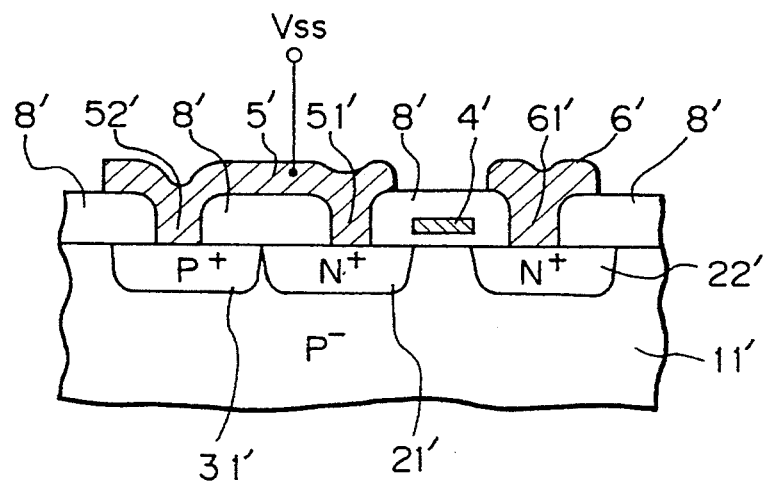
FIG. 2 is a sectional view showing the single inverter portion of the semiconductor delay circuit device shown in FIG. 1.
Figure 3:
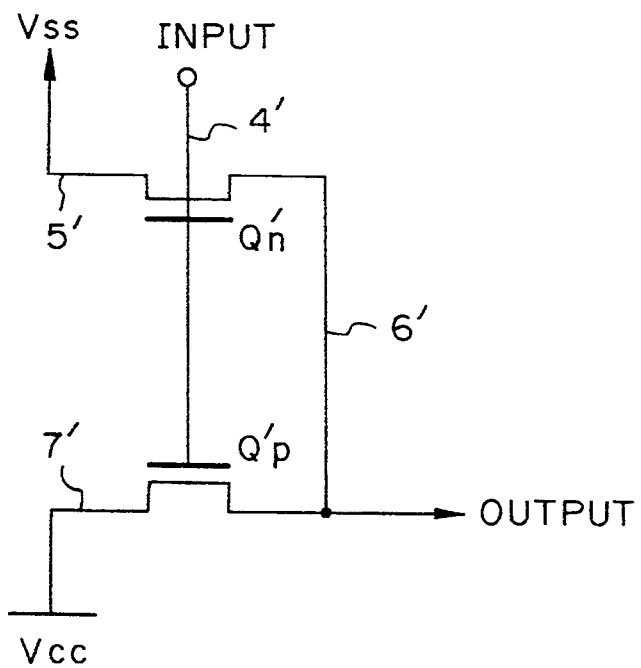
FIG. 3 is an equivalent circuit view showing the single inverter portion of the semiconductor delay circuit device shown FIG. 1.

As shown in FIG. 1, an N-channel transistor Q'n and a P-channel transistor Q'p constitute the inverter circuit. FIG. 2 is a sectional view showing the single inverter portion of the semiconductor delay circuit device shown in FIG. 1. In a $P^-$-type semiconductor substrate 11', the N-channel transistor Q'n comprises an $N^+$ diffusion layer acting as a source diffusion region 21' and a drain diffusion region 22'. Adjacent to the source diffusion region 21', there is a $P^+$ diffusion layer acting as a substrate contact diffusion region 31'. The numeral 4' is a polysilicon layer acting as a common gate electrode with respect to the N-channel transistor Q'n and P-channel transistor Q'p (which is not shown in FIG. 2). The numeral 41' is an aluminum wire for input signals connected to the polysilicon layer 4'. The numeral 5' is an aluminum wire connected to the source diffusion region 21' and substrate contact diffusion region 31' at respective contact portions 51' and 52'. The aluminum wire 5' is, for example, connected to a low potential power source Vss. The numeral 6' is an aluminum wire connecting the drain diffusion region 22' of the N-channel transistor Q'n to a drain diffusion region ($P^+$ layer) 23' of the P-channel transistor Qp' at respective contact portions 61' and 62'. Through the aluminum wire 6', output signals of the inverter circuit are picked up. On the other hand, a source diffusion region ($P^+$ layer) 24' and a substrate contact diffusion region ($N^+$ layer) 32' adjacent to the region 24' of the P-channel transistor Q'p are connected to an aluminum wire 7' via respective contact portions 71' and 72'. The aluminum wire 7' is, for example, connected to a high potential power source Vcc. The numeral 8' indicates an insulation film such as a silicon oxide film. FIG. 3 is an equivalent circuit view showing the single inverter portion of the semiconductor delay circuit device shown in FIG. 1.

FIG. 1 shows only the layout of the portion constituting the single inverter in the semiconductor delay circuit device. Recently such a layout pattern of a semiconductor delay circuit device tends to be increasingly miniaturized. As a result, an inverter, for example the one mentioned above, is arranged adjacent to another inverter. The same conduction type (P-channel type or N-channel type) transistors are then arranged such that their source regions are integrally formed with each other to constitute a common source region. In this case, a substrate contact diffusion layer (region), which is an $N^+$ layer or $P^+$ layer that is of an opposite conduction type relative to the common source region and has a higher impurity density than a substrate, is arranged for the common source region, and separately from the common source region. The common source region and substrate contact diffusion region are connected to a predetermined power source via aluminum wiring.

However, when a transistor is operating with the above-mentioned arrangement, an operation current of the transistor flows to aluminum wiring via the above-mentioned common source region. Then, due to contact resistance between the common source region and the aluminum wiring, etc., a source potential of the other transistor having the common source region varies so that characteristics, (for example, a threshold voltage) of the other transistor may be influenced.

The object of the present invention is to solve such a problem. Even if source regions of a pair of the same conduction type transistors are arranged adjacent to each other and facing each other, the source regions are separated by a substrate contact diffusion region that is of an opposite conduction type relative to the source regions and has a higher impurity density than the substrate. As a result, the effect of an operation current flowing to one transistor never influences a source of the other transistor.

Further, according to the above-mentioned layout, the lines that connect the respective source and drain regions of the P-channel and N-channel transistors run in parallel with each other. The polysilicon layer having the gate electrodes of the respective transistors and the aluminum wiring for connecting the drain regions of the respective transistors are constituted by combining linear portions. Accordingly, a pattern forming a single inverter circuit, or in other words, an area needed for the layout of the inverter circuit, may have many useless portions making the overall pattern larger.

Therefore, when a particularly large number of inverter circuits, for example, connected in multiple stages, are provided, a problem is caused that they increase the general layout area that is the number of inverter circuits that can be arranged in a unit area is considerably limited.

The object of the present invention is to solve the above problem, so that the pattern of an inverter circuit can be miniaturized and improved to reduce the layout area to be as small as possible, or to increase the number of inverter circuits to be arranged in a unit area as much as possible.

Figure 4:
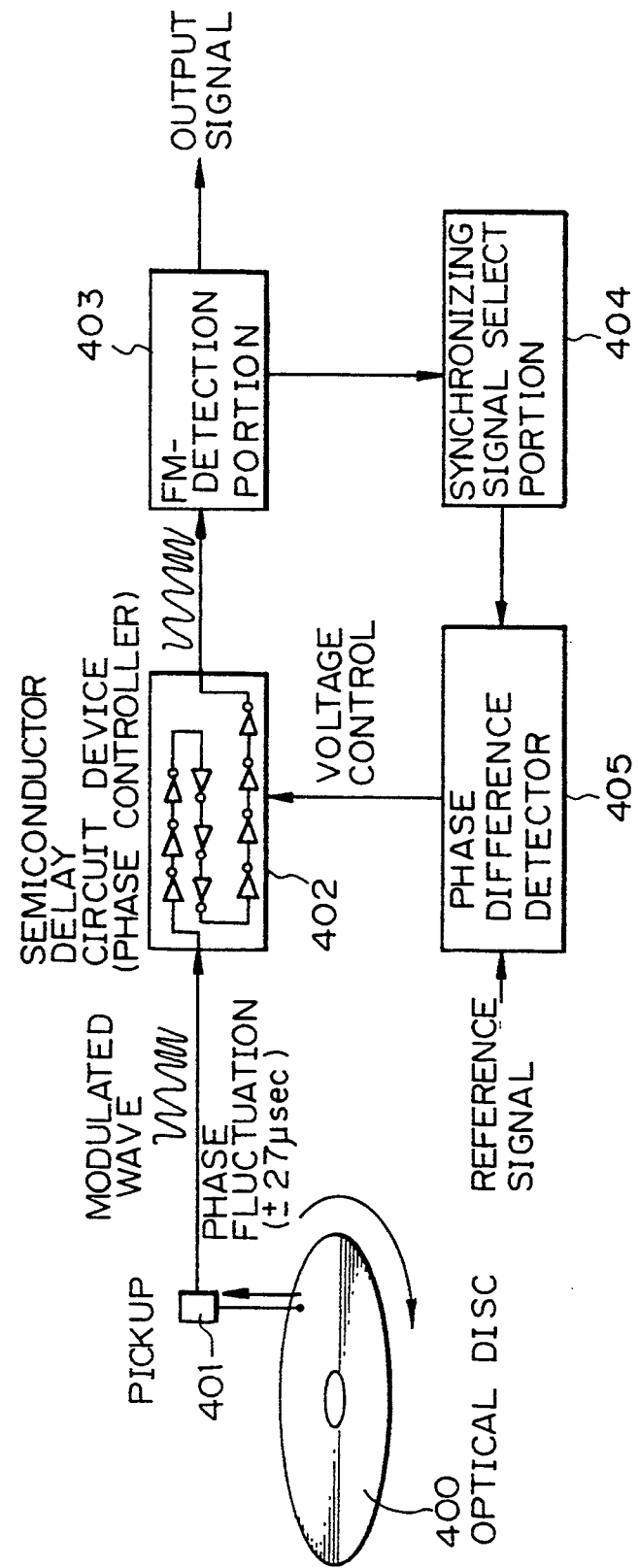
FIG. 4 is a block diagram showing an optical disc system as an example of using the semiconductor delay circuit device.

FIG. 4 is a block view showing an optical disc system for an example of using the semiconductor delay circuit device. As described above, a semiconductor delay circuit device is used for an optical disc system, and is used for delaying a detected signal of the optical disc system to maintain synchronization, even if a center position of an optical disc is shifted.

As shown in FIG. 4, an optical disc system is basically constituted by a pickup 401, a semiconductor delay circuit device (phase controller) 402, an FM-detection portion 403, a synchronizing signal select portion 404, and a phase difference detector 405. Data (for example, a video signal data or an audio signal data) stored on an optical disc 400 is picked up by the pickup 401, and an output signal of the pickup 401 is supplied to the semiconductor delay circuit device 402. An output signal of the semiconductor delay circuit device 402 is supplied to the FM-detection portion 403, and an output signal of the optical disc system, for example, a video signal or an audio signal, is output from the FM-detection portion 403. Note, a synchronizing signal is selected by the synchronizing signal select portion 404 via the FM-detection portion 403, and the output signal of the synchronizing signal select portion 404 is supplied to the phase difference detector 405. The phase difference detector 405 is also supplied with a reference signal, and the phase difference detector 405 outputs a voltage control signal to the semiconductor delay circuit device 402 by comparing the synchronizing signal from the synchronizing signal select portion 404 and the reference signal.

In the above description, the output signal of the pickup 401 is a frequency modulated signal including a phase fluction of $\pm 27$ μsec., and this phase fluction is caused by, for example, an eccentricity of a center position in the optical disc 400. Namely, the center position of the optical disc 400 cannot be formed perfectly at the exact center of the disc in a production step, so the semiconductor delay circuit device 402 is used for delaying the output signal from the pickup 401 to maintain a synchronization in accordance with the voltage control signal output from the phase difference detector 405. It is noted that the semiconductor delay circuit device 402 is, for example, constituted by a plurality of inverter circuits which are cascade-connected, and the output signal of the pickup 401 is delayed for synchronizing by the synchronizing signal from the synchronizing signal select portion 404 and the reference signal in accordance with a value of a power supply voltage, which is the voltage control signal, applied to the plurality of inverter circuits in the semiconductor delay circuit device. Consequently, the output signal of the optical disc system, which is the output signal of the FM-detection portion 403, is maintained in a stable state with no phase fluction. In the above description, a delay value of the semiconductor delay circuit device 402 is determined to be a value larger than the phase fluction range (for example, $\pm 27$ μsec.) of the frequency modulated signal picked up by the pickup 401. For example, the delay value of the semiconductor delay circuit device 402 is determined to be 60 μsec.

Figure 5:
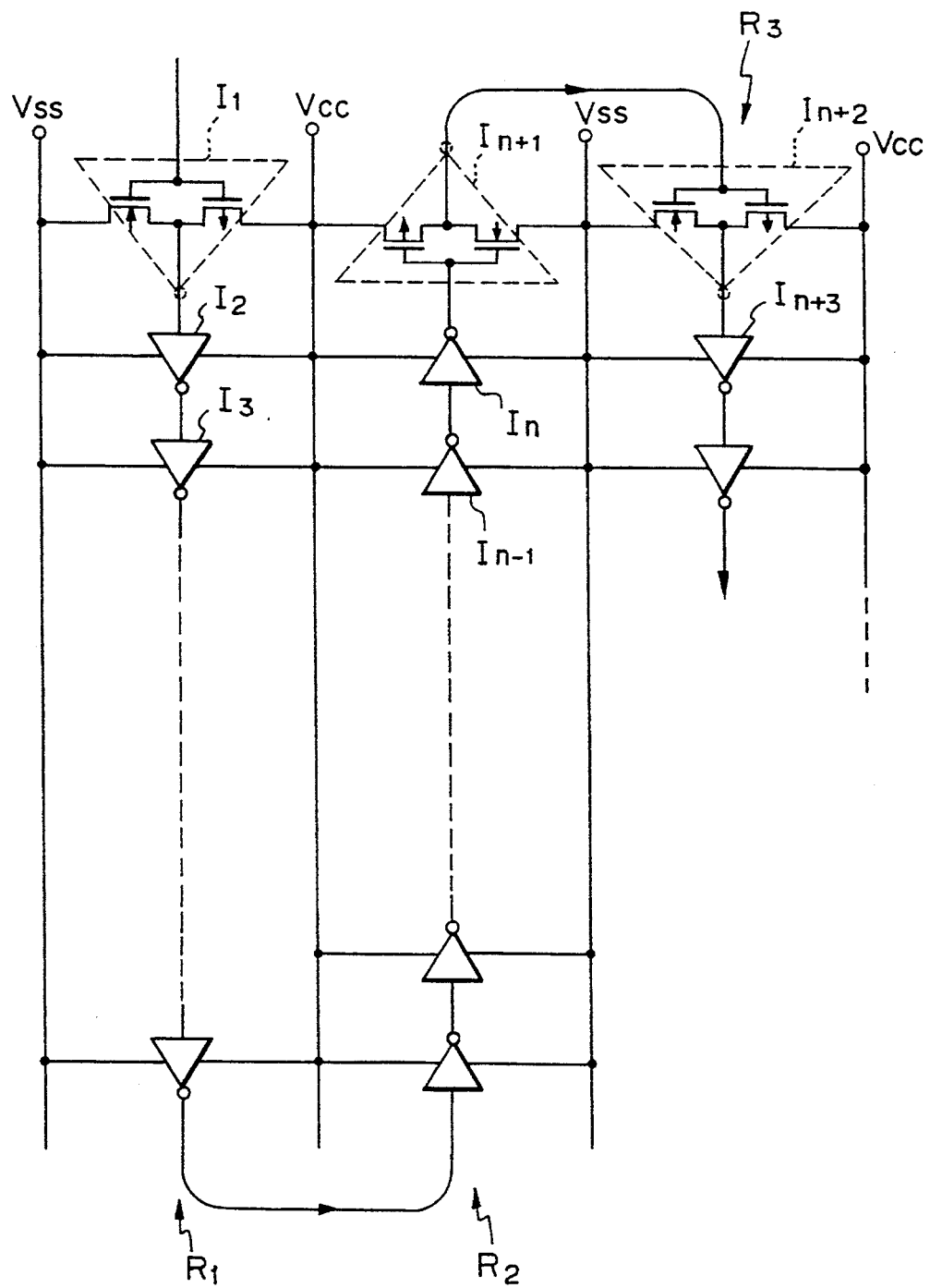
FIG. 5 is a circuit view showing the semiconductor delay circuit device shown in FIG. 4.

FIG. 5 is a circuit view showing the semiconductor delay circuit device shown in FIG. 4. As shown in FIG. 5, the semiconductor delay circuit device 402 is constituted by a plurality of inverter circuits $I_1, I_2, I_3, \ldots, I_{n-1}, I_n, I_{n+1}, \ldots$ For example, the semiconductor delay circuit device 402 is constituted by a plurality of rows $R_1, R_2, R_3, \ldots$ with each of the rows including a few hundred inverters, and the semiconductor delay circuit device 402 is constituted by 24000 stages of inverter circuits which are cascade-connected.

Next, preferred embodiments of the present invention will be described.

Below, some embodiments of a semiconductor delay circuit device according to the present invention will be explained with reference to the drawings.

Figure 6:
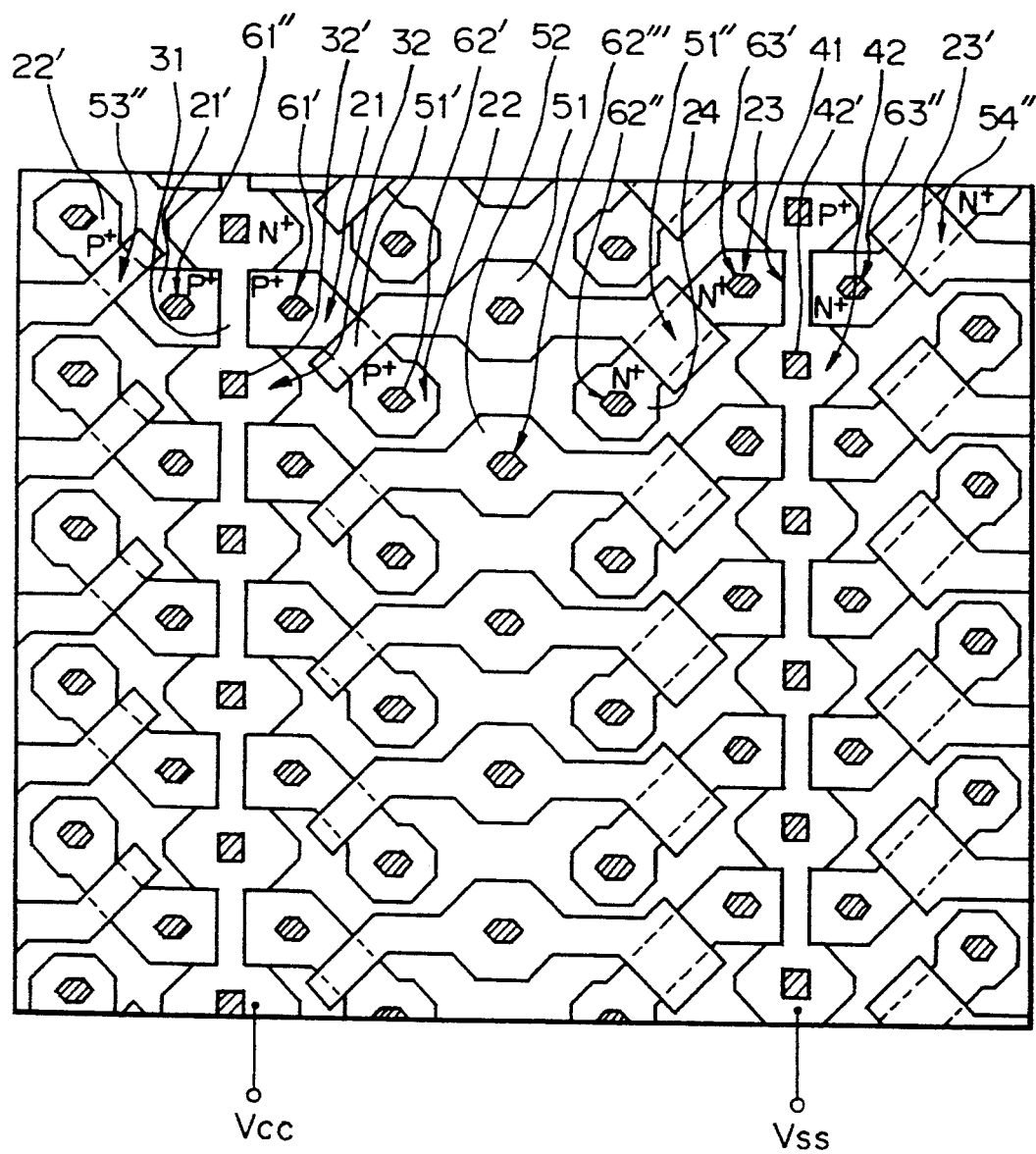
FIG. 6 is a plan view showing a layout of a semiconductor delay circuit device according to a first embodiment of the present invention.
Figure 7:
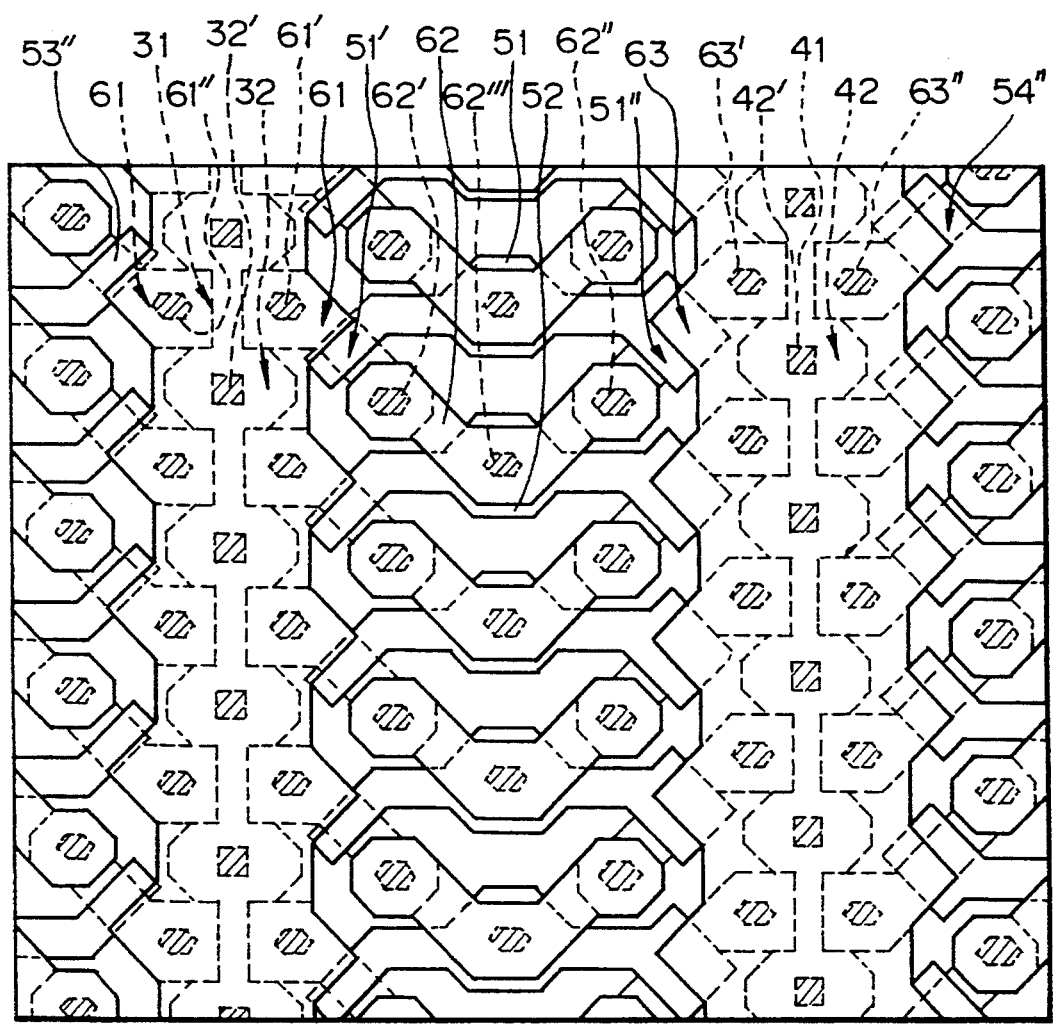
FIG. 7 is a plan view showing a layout of the semiconductor delay circuit device of FIG. 6 with a first aluminum wiring layer emphasized.
Figure 8:
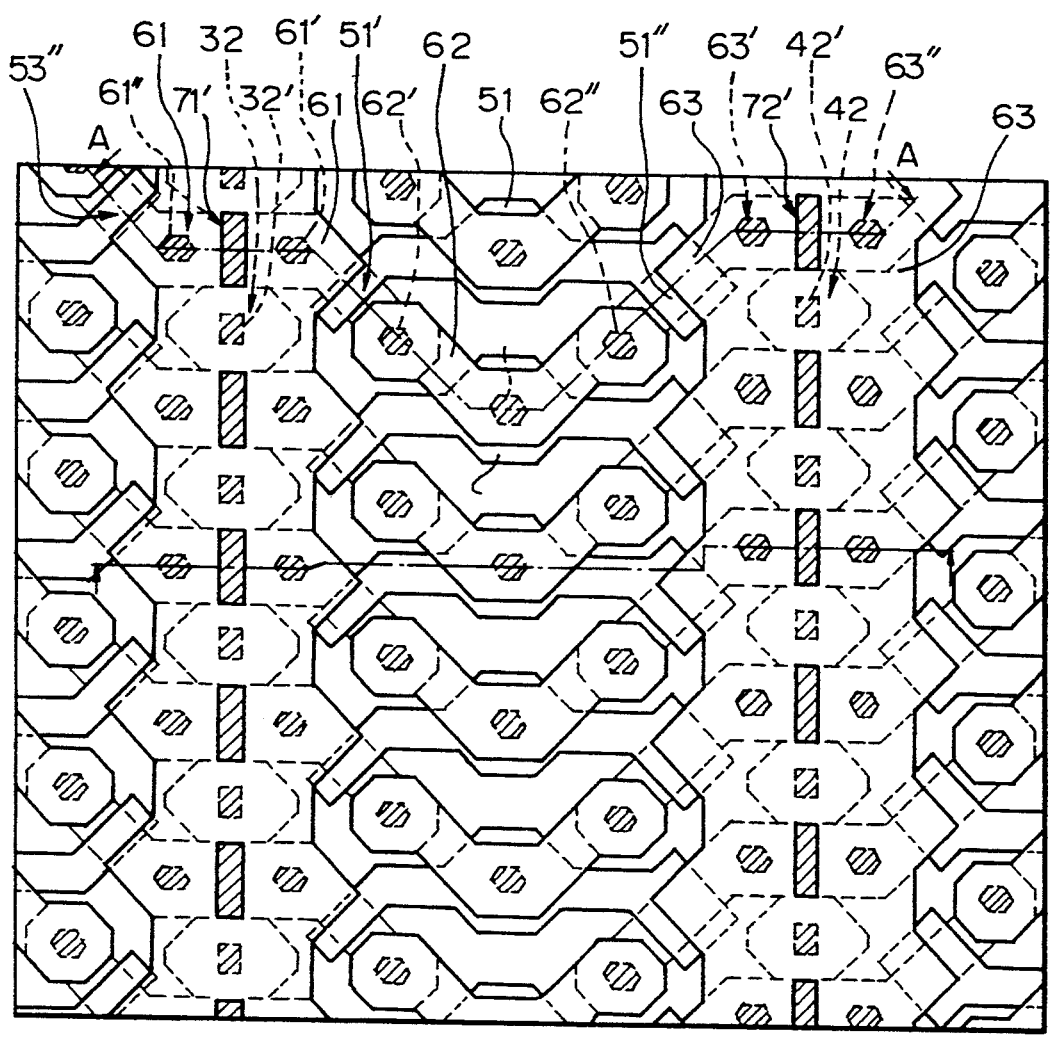
FIG. 8 is a plan view showing a layout of the semiconductor delay circuit device of FIG. 6 with contacts between the first and second a aluminum wiring layers emphasized.

FIGS. 6 to 8 show a layout of a semiconductor delay circuit device according to an embodiment of the present invention. In the semiconductor delay circuit device, multistage inverter circuits, which comprise P-channel transistors and N-channel transistors, are cascade-connected. Namely, wiring (aluminum wiring) for connecting respective drain regions of a predetermined inverter circuit is connected to a conductive layer, for example, a polysilicon layer, having respective gate electrodes of an inverter circuit of the next stage. In this way, many inverters are successively connected in multiple stages, for example, 24000 stages, and in multiple columns to form a delay circuit, etc.

FIG. 6 shows a layout pattern including source and drain diffusion regions of the P-channel transistors and N-channel transistors that constitute inverter circuits, polysilicon layers having gate electrodes of the respective transistors, and substrate (power source) contact diffusion layers (regions) that are arranged between respective source regions of the P-channel transistors constituting adjacent inverters and between respective source regions of the N-channel transistors constituting adjacent inverters.

Namely, in FIG. 6, numerals 21 and 22 are source and drain regions (both P+ diffusion layers) of the P-channel transistor constituting a predetermined inverter, respectively. Numerals 23 and 24 are source and drain regions (both N+ diffusion layers) of the N-channel transistor constituting the inverter, respectively. Numeral 51 is a polysilicon layer. Both edge portions 51' and 51" of the polysilicon layer function as gate electrodes of the P-channel transistor and N-channel transistor. Numeral 52 is a polysilicon layer having gate electrodes of respective transistors constituting an inverter of the next stage. The polysilicon layer 52 is connected to aluminum wiring which is indicated as a first layer aluminum wiring 62 in FIGS. 7, 8 and 11, for connecting the drain regions 22 and 24 of the respective transistors. Numerals 62', 62" and 62''' are aluminum contacts, for example, refer to FIG. 11, for connecting the aluminum wiring 62 to the drain regions 22 and 24 and polysilicon layer 52.

Numerals 31 and 32 are substrate contact diffusion regions (N+ diffusion layers) arranged between the respective source regions of P-channel transistors that constitute adjacent inverters. The substrate contact diffusion region 31 is arranged to interpose between the source regions 21 and 21' of the P-channel transistors that face each other in the length direction, i.e., the P-channel transistors that constitute inverters of adjacent columns. The width of the region 31, i.e., a facing distance of the source regions 21 and 21', may be narrower than, for example, the minimum channel length of one of the transistors constituting the inverter (in this example, the channel length of the P-channel transistor). Numerals 22' and 53" are a drain region and a gate electrode, respectively, of the P-channel transistor constituting the inverter of the adjacent column. On the other hand, the substrate contact diffusion region 32 is arranged to interpose between the source regions of the P-channel transistors constituting inverters of consecutive stages. Each edge portion of the region 32 protrudes to approach a channel forming region, which is a portion just under a gate electrode 51', of a transistor having the corresponding source region, for example, the P-channel transistor having the source region 21. Numerals 61', 61" and 32' are aluminum contacts for connecting the source regions 21 and 21' and substrate diffusion regions 31 and 32 with aluminum wiring, for example, indicated as a first layer aluminum wiring 61 in FIGS. 7, 8 and 11.

Similarly, numerals 41 and 42 are substrate contact diffusion regions (P+ diffusion layers) arranged between the source regions of N-channel transistors constituting adjacent inverters. The region 41 is arranged to interpose between the source regions 23 and 23' of the N-channel transistors facing each other in the length direction, i.e., the N-channel transistors constituting inverters of adjacent columns. The width of the region 41, i.e., a facing distance between the source regions 23 and 23', can also be narrower than the minimum channel length of one of the respective transistors constituting the inverter (in this embodiment, the channel length of the P-channel transistor). Numerals 24' and 54" are a drain region and a gate electrode, respectively, of the N-channel transistor constituting each of the inverters of the adjacent columns. On the other hand, the region 42 is arranged to interpose between the source regions of the N-channel transistors constituting inverters of adjacent stages. Each edge portion of the region 42 protrudes to approach a channel forming region, which is a portion just under a gate electrode 51", of the transistor having the corresponding source region, for example, the N-channel transistor having the source region 23. Numerals 63', 63" and 42' are aluminum contacts for connecting the source regions 23 and 23' and substrate contact diffusion regions 41 and 42 with aluminum wiring, for example, a first layer aluminum wiring 63 in FIGS. 7, 8 and 11.

Figure 9:
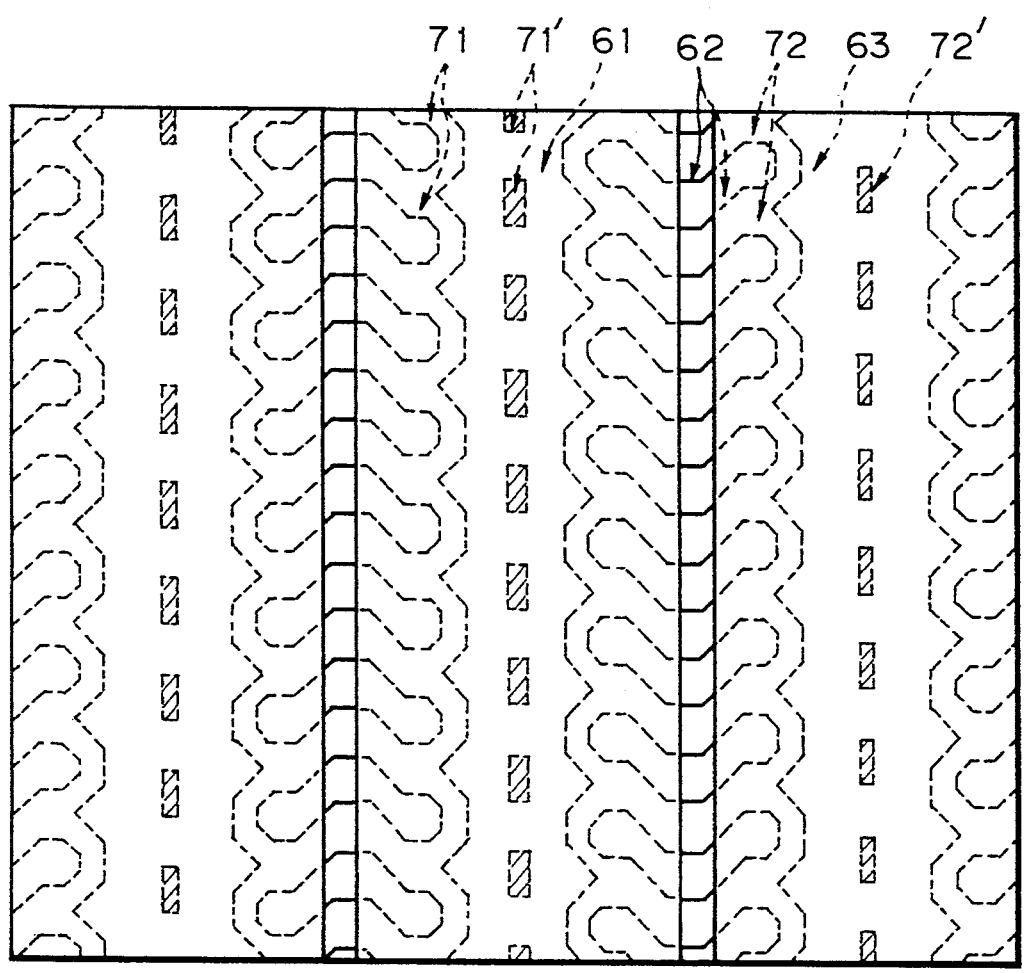
FIG. 9 is a plan view showing a layout of the semiconductor delay circuit device of FIG. 6 with the first and second aluminum wiring layers emphasized.

FIG. 7 shows, in addition to the layout pattern shown in FIG. 6, a layout pattern of the first layer aluminum wiring. As shown in FIG. 7, the aluminum wiring 62 for connecting the drain regions of respective transistors constituting a predetermined inverter with a polysilicon layer has gate electrodes of an inverter of the next stage, the aluminum wiring 61 for connecting the respective source regions of P-channel transistors constituting respective inverters with the substrate contact diffusion regions (N+ layers) is disposed between the source regions, and the aluminum wiring 63 for connecting the source regions of N-channel transistors of respective inverters with the substrate contact diffusion regions (P+ layers) is disposed between the source regions. FIG. 8 shows, in addition to the respective layout patterns shown in FIG. 7, a layout pattern of an aluminum contact 71' for connecting the first layer aluminum wiring 61 with a second layer aluminum wiring 71, for example, refer to FIGS. 9 and 11, and an aluminum contact 72' for connecting the first layer aluminum wiring 63 with an aluminum wiring 72, for example, refer to FIGS. 9 and 11. FIG. 9 shows a layout pattern of the first layer aluminum wirings 61, 62 and 63, and the second layer aluminum wirings 71 and 72.

Figure 10:
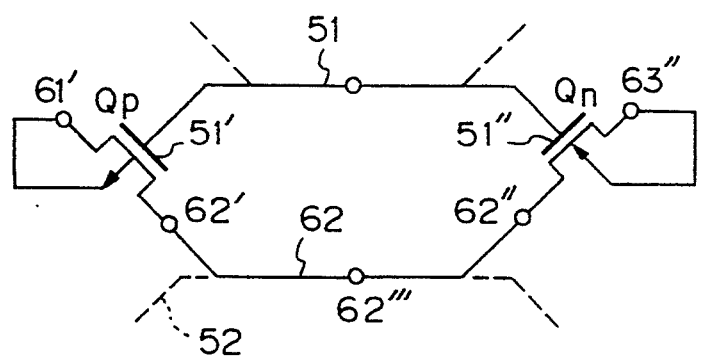
FIG. 10 is an equivalent circuit view showing one inverter portion of the semiconductor delay circuit device shown in FIG. 8.
Figure 11:
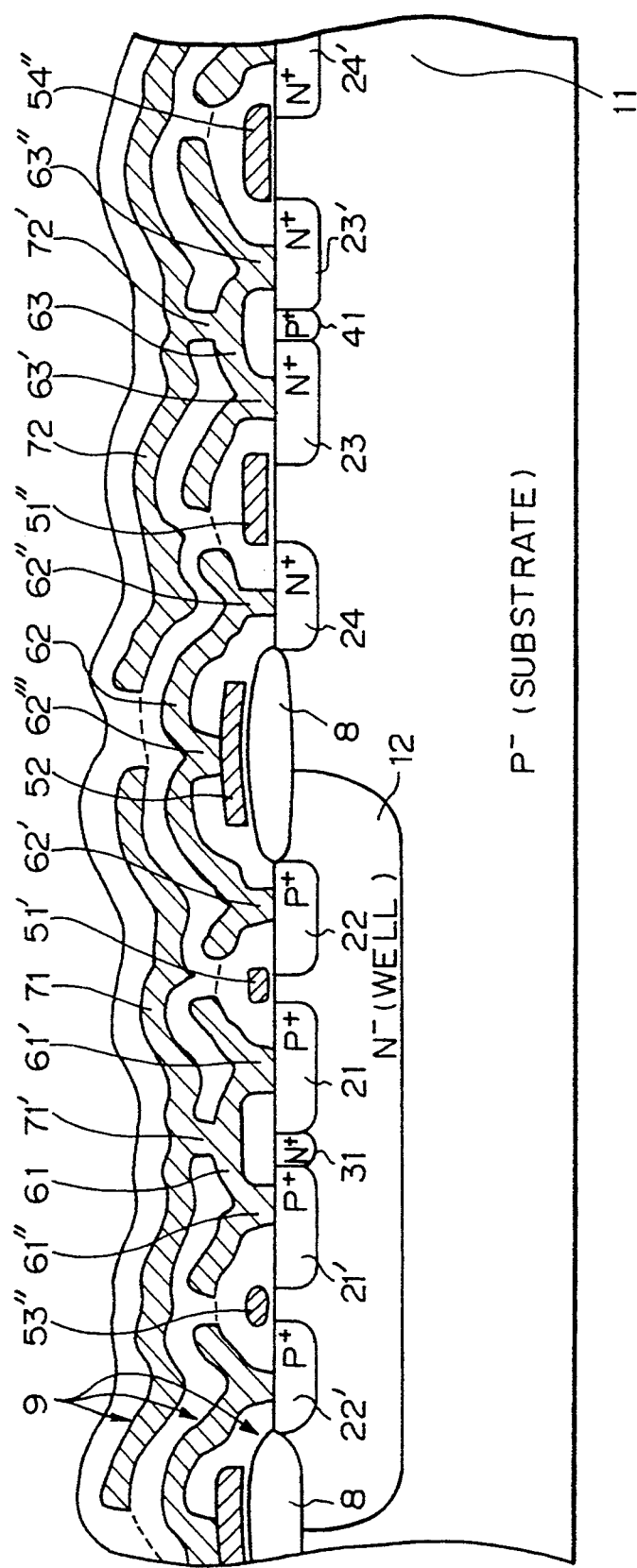
FIG. 11 is a sectional view showing the semiconductor delay circuit device taken along a line A—A of FIG. 8.
Figure 12:
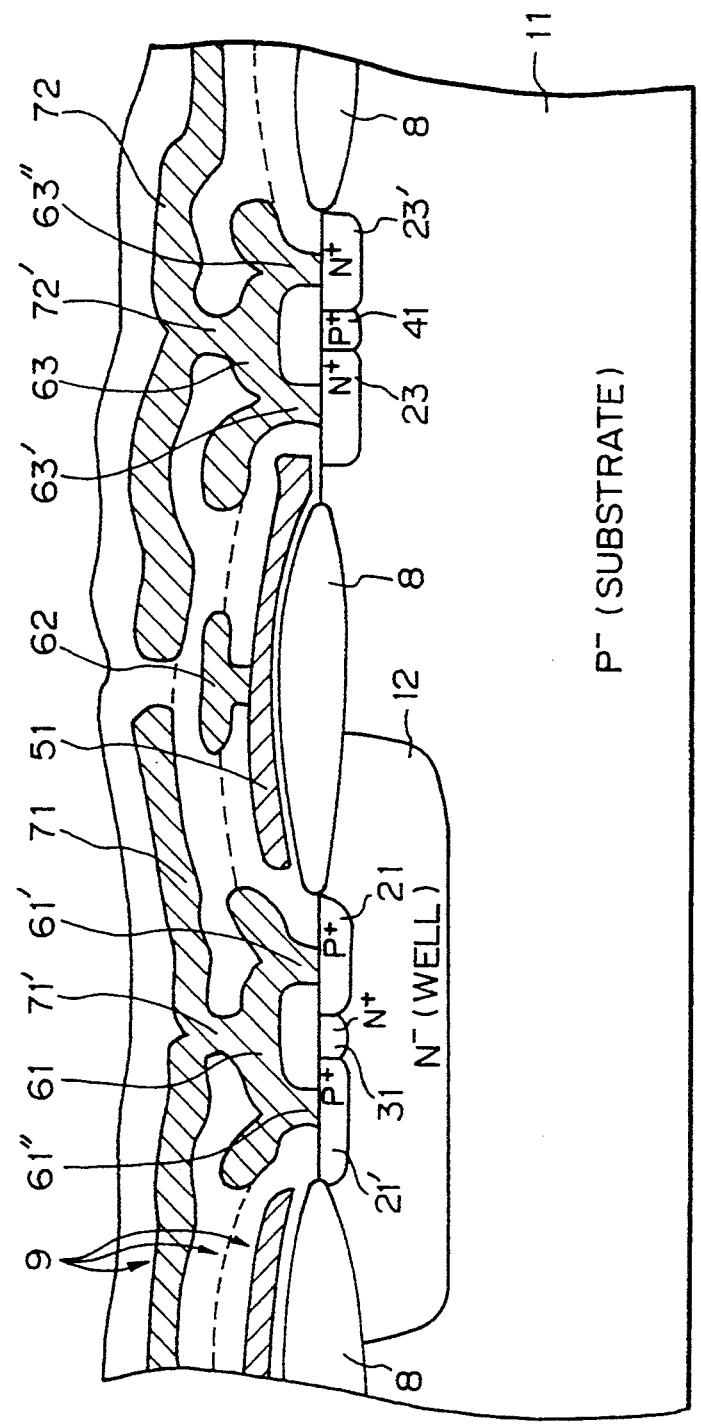
FIG. 12 is a sectional view showing the semiconductor delay circuit device taken along a line B—B of FIG. 8.

FIG. 10 shows an equivalent circuit of a single inverter portion of the layout pattern shown in FIG. 8. A reference mark Qp indicates a P-channel transistor and Qn an N-channel transistor. FIGS. 11 and 12 are sectional views showing the semiconductor delay circuit device, taken along a line A—A and a line B—B of FIG. 8, respectively. In FIGS. 11 and 12, numeral 11 is a P$^-$-type semiconductor substrate, 12 an N$^-$-type well, 8 a field oxide film, and 9 an interlayer insulation film.

Figure 13:
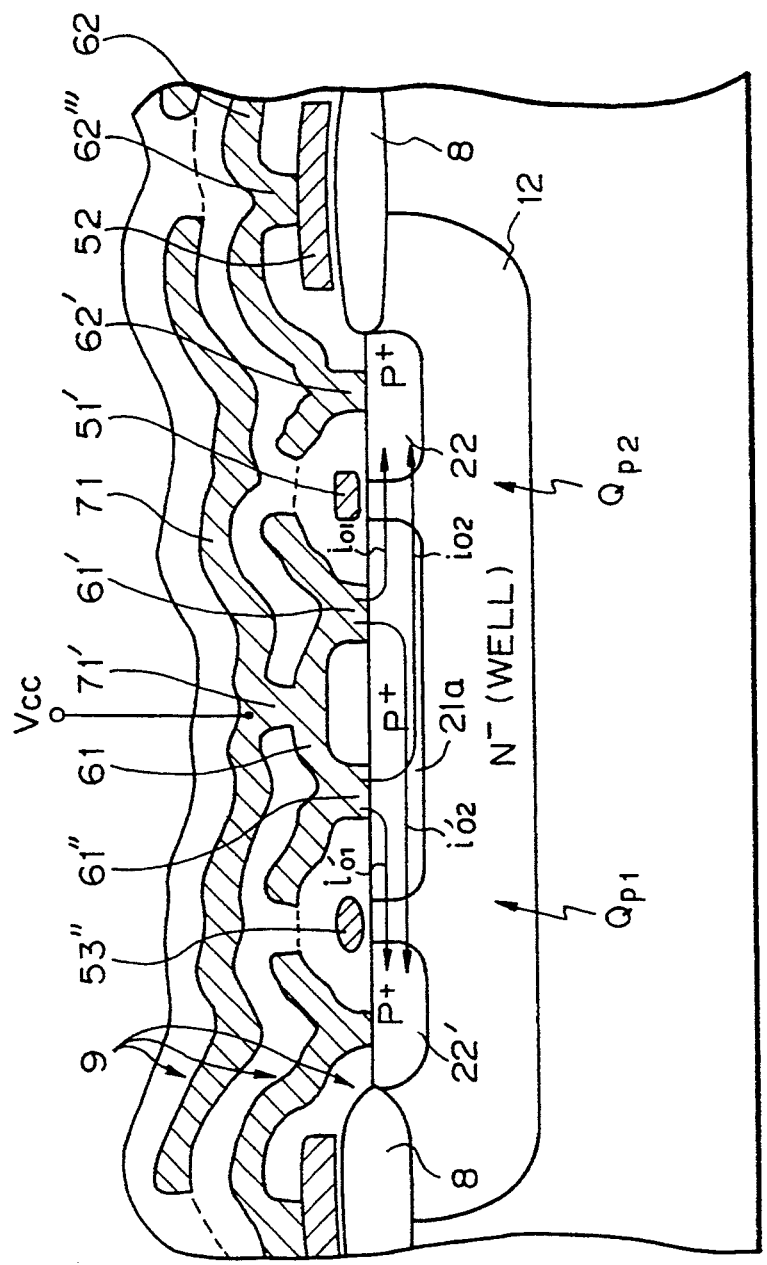
FIG. 13 is a sectional view showing a part of the semiconductor delay circuit device according to the prior art.
Figure 14:
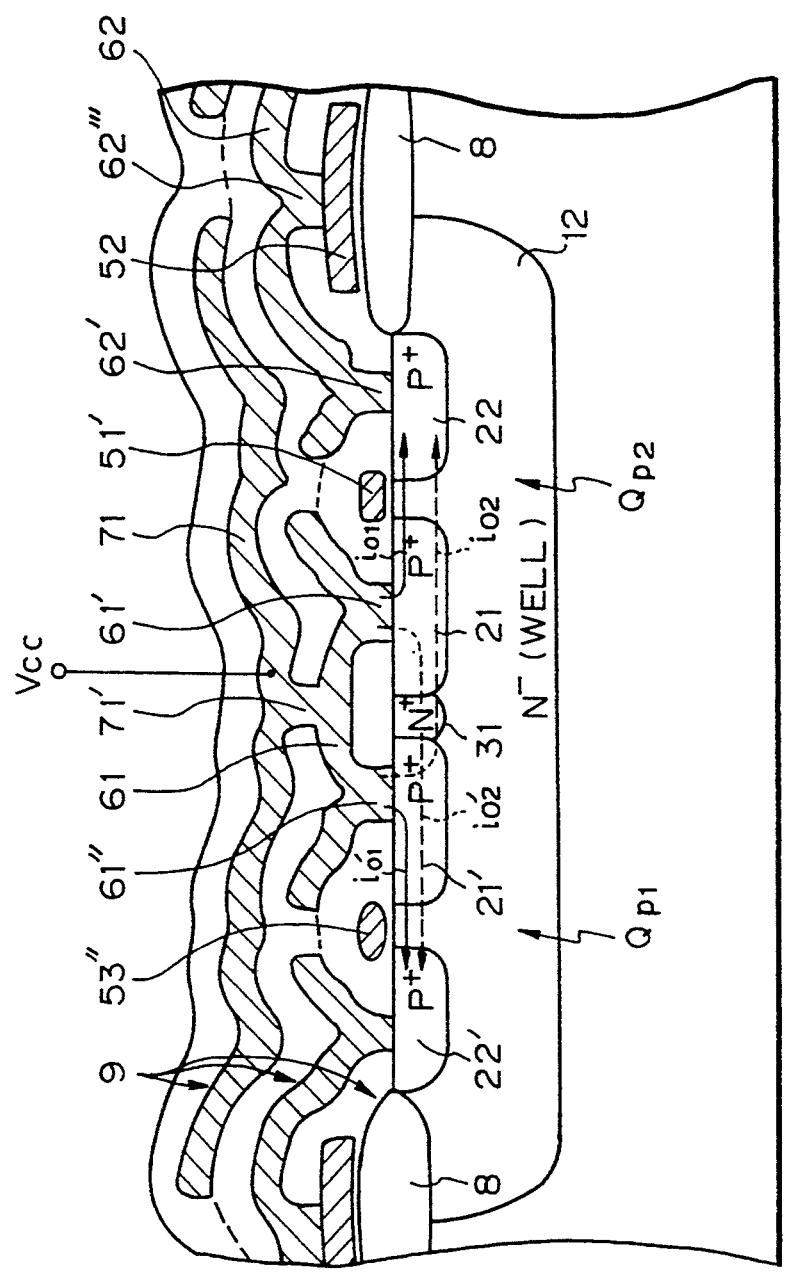
FIG. 14 is a sectional view showing a part of the semiconductor delay circuit device according to the present invention.

FIG. 13 is a sectional view showing a part of the semiconductor delay circuit device according to the prior art, and FIG. 14 is a sectional view showing a part of the semiconductor delay circuit device according to the present invention.

As shown in FIG. 13, in the prior art semiconductor delay circuit device, two P-channel transistors $Qp_1$ and $Qp_2$, whose source regions are commonly formed as a common source region 21a of the prior art semiconductor delay circuit device, influence each other by way of the common source region 21a.

Namely, when the P-channel transistor $Qp_1$ is operating and a current flows from aluminum wiring 61 via the common source region 21a to a drain region 22', the current flowing to the drain region 22' of the transistors $Qp_1$ does not only flow from the aluminum wiring 61 passing through an aluminum contact 61" and the common source region 21a (which is shown by a reference $i_{01}'$ in FIG. 13), but also flows from the aluminum wiring 61 passing through an aluminum contact 61' and the common source region 21a (which is shown by a reference $i_{02}'$ in FIG. 13).

Similarly when the P-channel transistor $Qp_2$ is operating and a current flows from the aluminum wiring 61 via the common source region 21a to a drain region 22, the current flowing to the drain region 22 of the transistors $Qp_2$ does not only flow from the aluminum wiring 61 passing through the aluminum contact 61' and the common source region 21a (which is shown by a reference $i_{01}$ in FIG. 13), but also flows from the aluminum wiring 61 passing through the aluminum contact 61" and the common source region 21a (which is shown by a reference $i_{02}$ in FIG. 13). Note, the above pair of transistors of the same conduction type are arranged adjacent to each other and facing each other, and the semiconductor delay circuit device comprises a plurality of pairs of the same conduction type transistors. Therefore, an input signal of the semiconductor delay circuit, for example, an output signal of a pickup in an optical disc system, is distorted.

Conversely, as shown in FIG. 14, in the semiconductor delay circuit device of the present invention, source regions 21' and 21 of two P-channel transistors $Qp_1$ and $Qp_2$ are formed separately by a substrate contact diffusion region 31. Note, a conduction type of the substrate contact diffusion region 31 is opposite to that of the source regions 21 and 21' of the two P-channel transistors $Qp_1$ and $Qp_2$. Namely, the substrate contact diffusion region 31 is an N-channel type (N+ diffusion layer) and each of the source regions 21 and 21' of the two P-channel transistors $Qp_1$ and $Qp_2$ is a P-channel type (P+ diffusion layer) opposite to the substrate contact diffusion region 31. Therefore, the P-channel transistors $Qp_1$ and $Qp_2$ are not influenced by each other.

Namely, when the P-channel transistor $Qp_1$ is operating and a current flows from aluminum wiring 61 to a drain region 22', the current flowing to the drain region 22' of the transistors $Qp_1$ only flows from the aluminum wiring 61 passing through an aluminum contact 61" and the source region 21' (which is shown by a reference $i_{01}'$ in FIG. 14), and the current never flows from the aluminum wiring 61 passing through an aluminum contact 61', the source region 21, 21' and the substrate contact diffusion region 31 (which is shown by a reference $i_{02}'$ in FIG. 14), since the current $i_{02}'$ is blocked by the substrate contact diffusion region 31.

Similarly, when the P-channel transistor $Qp_2$ is operating and a current flows from aluminum wiring 61 to a drain region 22, the current flowing to the drain region 22 of the transistors $Qp_2$ only flows from the aluminum wiring 61 passing through an aluminum contact 61' and the source region 21 (which is shown by a reference $i_{01}$ in FIG. 14), and the current never flows from the aluminum wiring 61 passing through an aluminum contact 61" and the source region 21', 21 and the substrate contact diffusion region 31 (which is shown by a reference $i_{02}$ in FIG. 14), since the current $i_{02}$ is blocked by the substrate contact diffusion region 31.

As described above, the semiconductor delay circuit device of the present embodiment has the effect that operation current flowing to one transistor never influences a source potential of the other transistor adjacent to and facing the first transistor.

Figure 15:
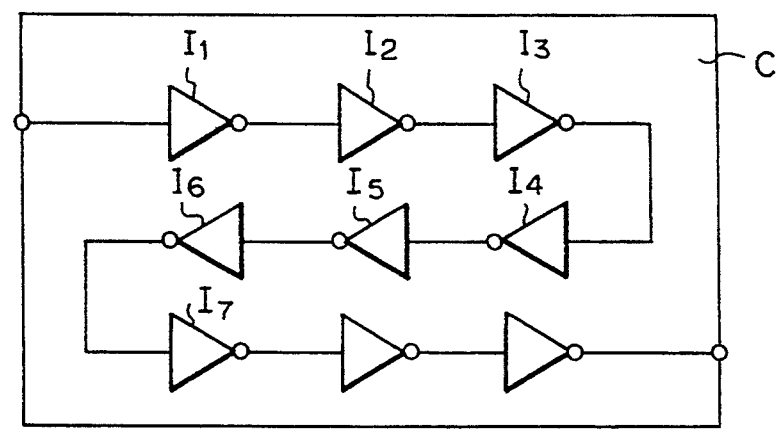
FIG. 15 a circuit view showing the semiconductor delay circuit device according to the present invention.
Figure 16:
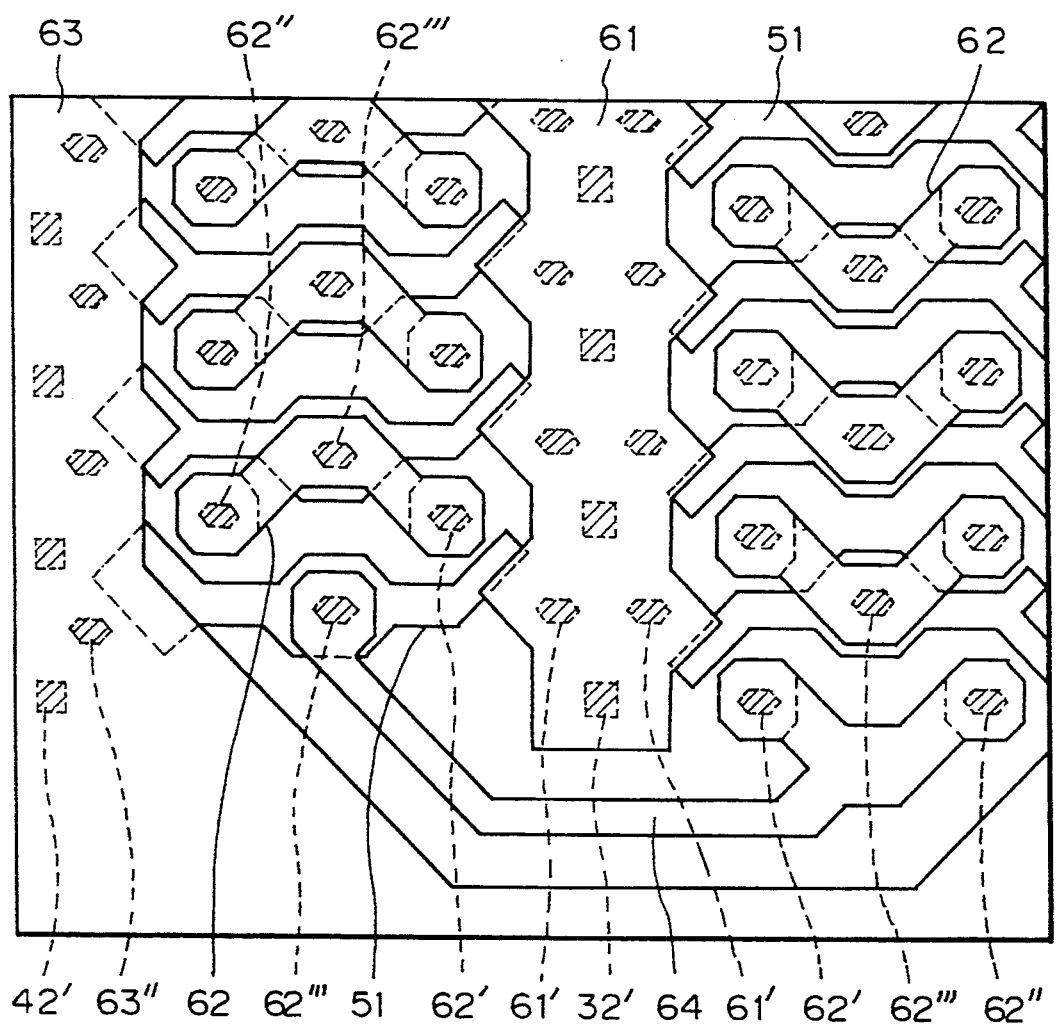
FIG. 16 is view showing the details of a connection portion between inverter columns shown in FIG. 15.

FIG. 15 shows an equivalent circuit of the semiconductor delay circuit device employing the present invention, in which numerals $I_1$ to $I_7$ indicate inverters and "C" an IC chip. FIG. 16 shows the details of a connection portion between inverter columns shown in FIG. 15. The connection portion between inverters of adjacent columns is indicated with a numeral 64. Other reference marks are common to those shown in the other figures.

As described above, according to the present embodiment, the source and drain regions 21, 22 and 23, 24 of the P-channel transistor and N-channel transistor constituting a single inverter circuit are arranged with an inclination such that a line connecting the source and drain regions 21 and 22 and a line connecting the regions 23 and 24 intersect each other. For example, they are inclined by 45° in a predetermined direction from a horizontal line of FIG. 6. Both faces of the conductive layer (polysilicon layer) 51 having the gate electrodes of these transistors are curved such that the gate electrodes 51' and 52" are orthogonal to a line connecting the source and drain regions 21 and 22 and a line connecting the regions 23 and 24. On the other hand, the aluminum wiring 62 for connecting the drain regions 22 and 24 of the respective transistors is curved opposite to the curve of the polysilicon layer 51. Namely, according to the present embodiment, a layout pattern of the respective component elements of single CMOS inverter circuit is constituted as mentioned above. Due to this, an area needed for the layout is fully reduced in both longitudinal and lateral directions. As a result, the number of inverters to be arranged in a limited chip area can drastically be increased.

In addition to the layout pattern of the respective component elements mentioned above, the aluminum contacts, for instance, 61' and 63', for the aluminum wiring 61 and 63 for the respective source regions and the aluminum contacts, for instance, 62', 62" and 62''', for the aluminum wiring 62 provided for the respective drain regions and polysilicon layers may each be formed with a hexagonal shape. Compared to an aluminum contact having the same contact area but a rectangular shape, the hexagonal contact can reduce the distance between adjacent aluminum contacts. It is noted that a design criteria related to the distance between the contacts is mainly determined according to a distance between protruding portions thereof. By combining the above-mentioned layout pattern with the hexagonal aluminum contacts, an overall layout area can effectively be miniaturized.

The reason why the substrate contact diffusion regions 31, 32, 41 and 42 have been disposed according to the present embodiment will be explained next.

First, the substrate contact diffusion region 32 (N+ layer) disposed between the source regions of P-channel transistors and the substrate contact diffusion region 42 (P+ layer) disposed between the source regions of N-channel transistors forming the inverters of adjacent stages are projectingly formed as mentioned above to approach the channel forming regions of the transistors having corresponding source regions. For example, they are projectingly formed to approach the channel forming regions, which are portions just under the gate electrodes 51', of the P-channel transistors having the source regions 21, and the channel forming regions, which are portions just under the gate electrodes 51", of the N-channel transistors having the source regions 23. The substrate contacts 32 and 42 are N+ or P+ layers of the same conduction type as that of the corresponding substrate (or well), and have a high impurity density and low resistance. By positioning the substrate contacts 32 and 42 in the vicinities of the channel forming regions of respective transistor as near as possible, potential variations in the substrate around the channel forming regions can be surely suppressed when the corresponding transistors are turned on. Therefore, even if many inverters, which are connected in multiple stages, are disposed in a limited area according to the miniaturization of the layout pattern as mentioned above, the diffusion regions 32 and 42 can surely control the potential variations in the substrate which corresponds to a potential of a back gate around the transistors that have been turned on so that the characteristics, for example, threshold voltages, of transistors constituting inverters of the next stage can be surely prevented from being affected. Arranging the diffusion regions 32 and 42 of the above-mentioned shapes does not hinder the miniaturization of the layout.

As the layout pattern of each inverter is miniaturized as mentioned above, transistors constituting respective inverters are closer to each other. Therefore, when a column of transistors sequentially connected in multiple stages (in the longitudinal direction of the figures) as mentioned above returns at a predetermined position to form an adjacent transistor column, respective source regions 21 and 21' of P-channel transistors facing each other in the length direction (lateral direction) come remarkably close to each other, and source regions 23 and 23' of N-channel transistors also come remarkably close to each other. In these cases, the source regions 21 and 21', or 23 and 23' may in theory by solidly formed with no problem. However, in practice, an operation current of one operating transistor, for example, the transistor having the source region 21, may flow to aluminum wiring via a common source region so that a source potential of the source region 21' of the other transistor may vary due to contact resistance, etc., between the source region and the aluminum wiring. As a result, the characteristics such as threshold voltage of the adjacent column transistor having the source region 21' may be affected.

However, according to the present embodiment, although the source regions of transistors in the adjacent columns are arranged to face each other in the length direction as mentioned above, the N+ diffusion layer 31 and P+ diffusion layer 41 each of narrow width to separate all the source regions of adjacent transistors, are arranged between the source regions 21 and 21' of respective P-channel transistors and between the source regions 23 and 23' of respective N-channel transistors. Then, a current to each transistor flows to power source wiring (aluminum wiring) only via a source contact of the transistor itself so that an operation current flowing to one transistor may not influence the other transistor (i.e., its characteristics).

Namely, even if adjacent source regions are closely positioned, the source regions are separated by the substrate contact diffusion region comprising the N+ layer or P+ layer of opposite conduction type relative to the source regions and of higher impurity density than a substrate. This is why the present invention provides the contact diffusion region. In this case, the width of the contact diffusion region, i.e., a distance between the facing source regions, may be made narrower than the minimum length of a channel formed in the P-channel transistor or in the N-channel transistor, as mentioned above.

It is preferable that the distance between the source regions that are separated as mentioned above be less than 4 microns, and the distance between the source regions be less than the minimum width of diffusion.

Figure 17:
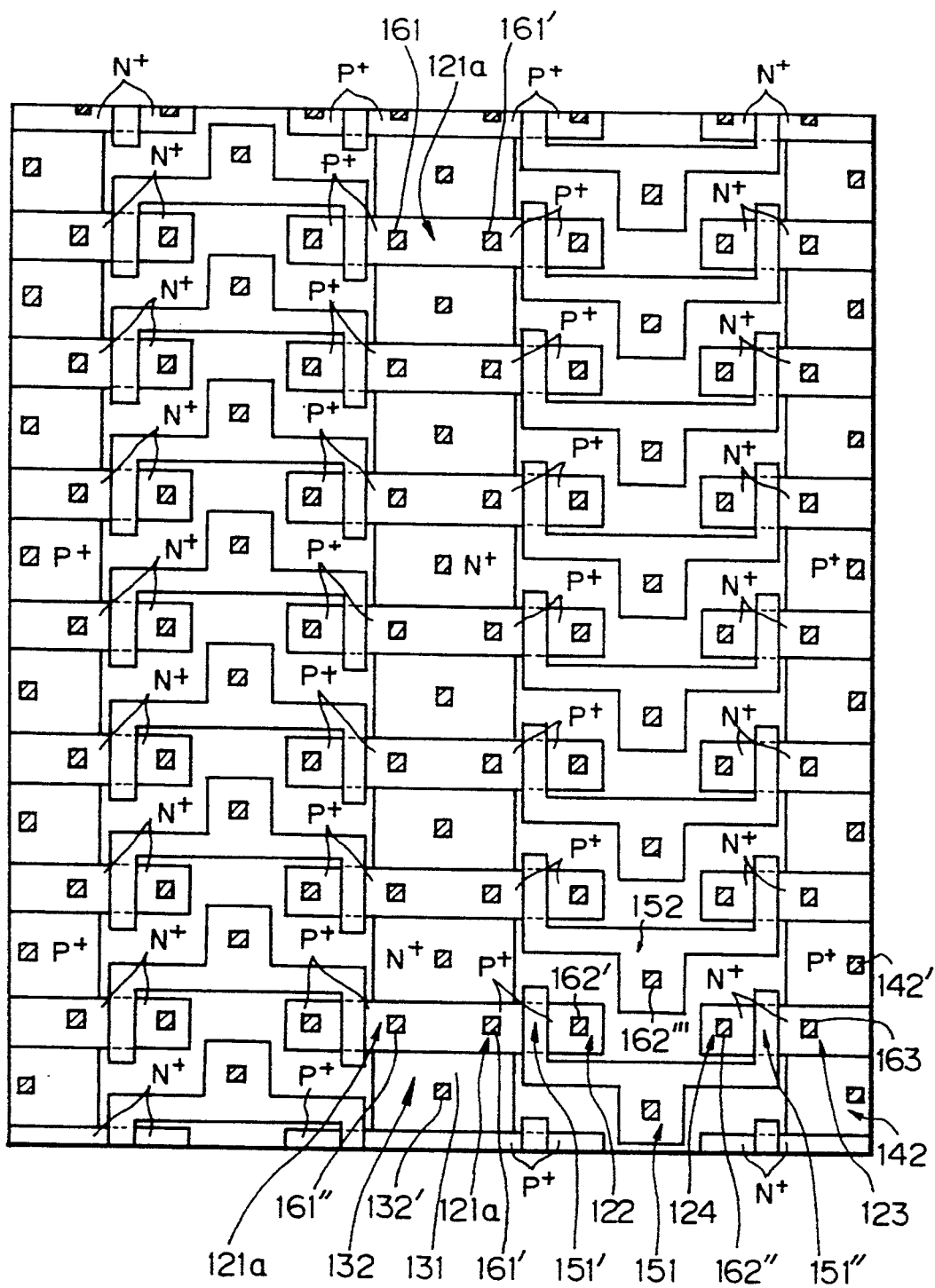
FIG. 17 is a plan view showing a layout of a semiconductor delay circuit device according to a prior art.
Figure 18:
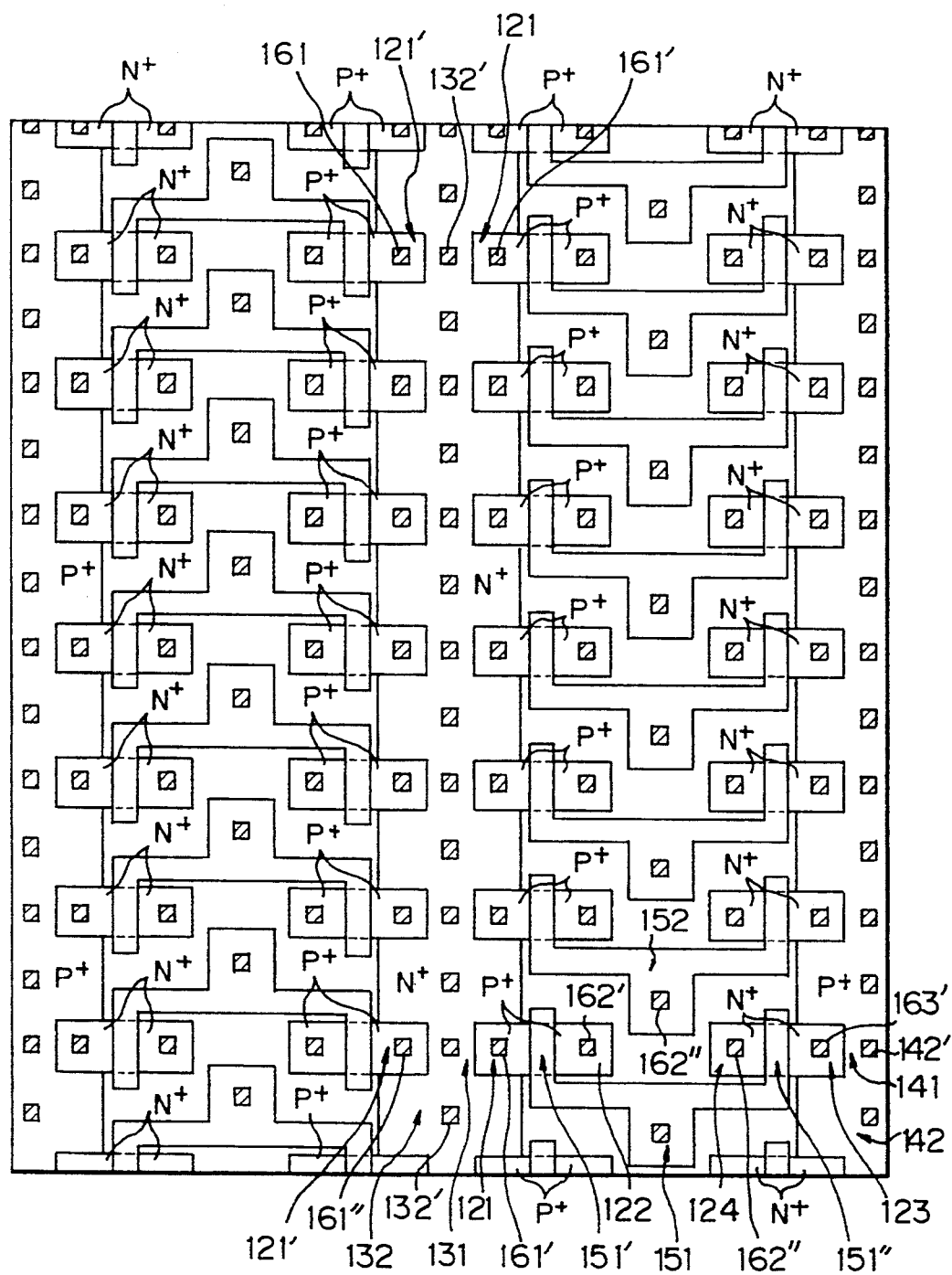
FIG. 18 is a plan view showing a layout of a semiconductor delay circuit device according to a second embodiment of the present invention.

FIG. 17 is a plan view showing a layout of a semiconductor delay circuit device according to a prior art, and FIG. 18 is a plan view showing a layout of a semiconductor delay circuit device according to a second embodiment of the present invention. Note, the semiconductor delay circuit device of FIG. 18 corresponds to the prior art semiconductor delay circuit device of FIG. 17. Comparing the semiconductor delay circuit devices shown in FIGS. 17 and 18, the semiconductor delay circuit device of FIG. 17 has a common source region 121a, and the semiconductor delay circuit device of the present embodiment (FIG. 18) has a separated source region 121 and 121' for each transistor. Namely, the semiconductor delay circuit device of the present embodiment has a substrate contact diffusion region 131 which is provided between the source regions 121 and 121', and a conduction type of the substrate contact diffusion region 131 is opposite to that of the source regions 121 and 121' of the transistors.

The semiconductor delay circuit devices of the present embodiment is similar to the embodiment shown in FIGS. 6 to 12, and the semiconductor delay circuit device comprises a plurality of inverter circuits which comprise P-channel transistors and N-channel transistors and are cascade-connected in plural columns.

In FIG. 18 numerals 121 and 123 are source regions of P-channel and N-channel transistors constituting a single inverter circuit, 122 and 124 drain regions of the P-channel and N-channel transistors, and 131 a substrate contact diffusion region (N+ layer) disposed between the source regions 121 of the P-channel transistor and a source region 121' of a P-channel transistor that is in the next column and adjacent to the source region 121 to face the source region 121. The substrate contact diffusion region 131 corresponds to the substrate contact diffusion region 31 of the first embodiment mentioned in the above. Numeral 132 is a substrate contact diffusion region (N+ layer) disposed between source regions of P-channel transistors that constitute inverters of adjacent stages, and corresponds to the substrate contact diffusion region 32 of the first embodiment. Similar to the diffusion region 32, the substrate contact diffusion region 132 protrudes to approach channel forming regions, for example, portions just under a gate electrode 151', of the P-channel transistors.

On the other hand, numeral 141 is a substrate contact diffusion region (P+ layer) disposed between the source region 123 of the N-channel transistor and a source region of an N-channel transistor that is positioned adjacent to the source region 123 and face the source region 123. The substrate contact diffusion region 141 corresponds to the substrate contact diffusion region 41 of the first embodiment. Further, numeral 142 is a substrate contact diffusion region (P+ layer) disposed between source regions of N-channel transistors that constitute inverters of adjacent stages, and corresponds to the substrate contact diffusion region 42 of the embodiment shown in FIGS. 6 to 12. Similar to the diffusion region 42, the substrate contact diffusion region 142 protrudes to approach channel forming regions, for example, a portion just under a gate electrode 151'', of the N-channel transistors.

Numeral 151 is a polysilicon layer both ends of which have gate electrodes 151' and 151''. A numeral 152 is a similar polysilicon layer disposed for an inverter of the next stage.

Figure 19:
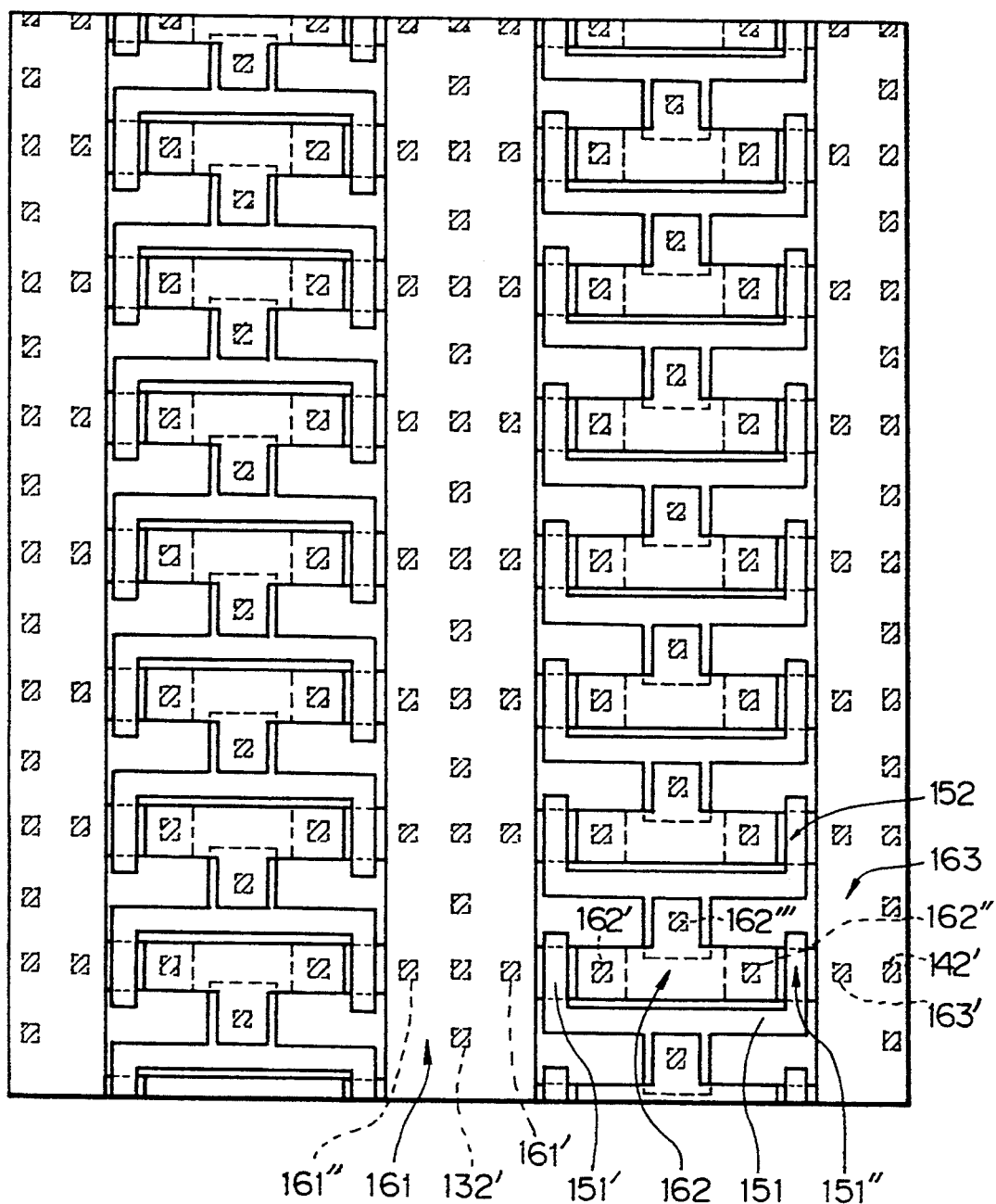
FIG. 19 is a plan view showing a layout of the semiconductor delay circuit device of FIG. 18 with aluminum wiring layers emphasized.

FIG. 19 shows layout patterns of aluminum wirings 161, 162 and 163, which correspond to the aluminum wirings 61, 62 and 63 of the embodiment shown in FIGS. 6 to 12 respectively, disposed on the layout pattern shown in FIG. 18. Namely, numeral 161 is a power source connecting aluminum wiring disposed on the source side of P-channel transistors, 162 is aluminum wiring for connecting the drain regions 122 and 124 of the P-channel and N-channel transistors constituting an inverter with the polysilicon layer disposed for an inverter of the next stage, and 163 is a power source connecting aluminum wiring disposed on the source side of N-channel transistors.

Numerals 161', 161'' and 132' are contacts for connecting the source regions 121 and 121' of P-channel transistors and the substrate contact diffusion regions 131 and 132 with the aluminum wiring 161. Numerals 162', 162'' and 162''' are contacts for connecting the drain region 122 of P-channel transistor, the drain region 124 of N-channel transistor and the polysilicon layer 152 respectively to the aluminum wiring 162. Numerals 163' and 142' are contacts for connecting the source region 123 of N-channel transistor and the substrate contact diffusion regions 141 and 142 respectively to the aluminum wiring 163 (a source region of N-channel transistor in the next column adjacent to the source region 123 to face the source region 123 being naturally connected to the aluminum wiring 163).

In this embodiment also, the substrate contact diffusion regions 131, 141 and 132, 142 provide the same effect as the regions 31, 41 and 32, 42 of the embodiment shown in FIGS. 6 to 12.

According to the present embodiment, even if source regions of same conduction type transistors are arranged adjacent to each other and facing each other, an effect of operation current flowing to one transistor never influences a source potential of the other transistor adjacent to and facing the first transistor. Therefore, characteristics, for example, a threshold voltage, of the other transistor can be surely prevented from varying.

Figure 20B:
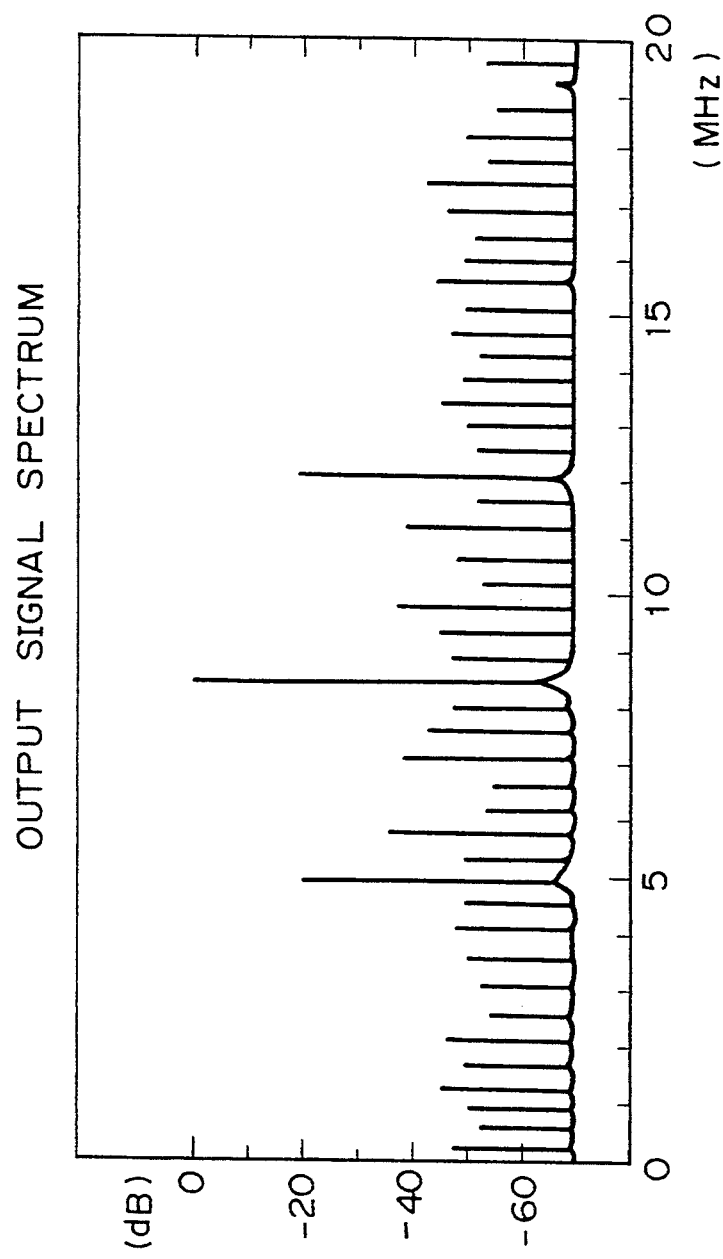
FIG. 20b is a graph showing a spectrum of an output waveform of a semiconductor delay circuit device according to a prior art.

FIG. 20a is a view showing a spectrum of an input waveform of a semiconductor delay circuit device, FIG. 20b is a view showing a spectrum of an output wave-form of a prior art semiconductor delay circuit device, and FIG. 20c is a view showing a spectrum of an output wave-form of a semiconductor delay circuit device according to the present invention.

Note, the input signal is a frequency modulated wave, a carrier of the input signal is at 8.5 MHz, and a modulation signal of the input signal is at 3.58 MHz. Further, the prior art semiconductor delay circuit device has a common source region such as shown in FIGS. 13, 17, and the like, and the semiconductor delay circuit device of the present invention has a substrate contact diffusion region and separated source regions such as shown in FIGS. 14, 18, and the like.

As shown in FIG. 20a, an input signal of a semiconductor delay circuit device has some peaks at about 1.3 MHz, 4.9 MHz, 8.5 MHz, 12.1 MHz, and 15.7 MHz.

As shown in FIG. 20b, and output signal which is delayed and output from the prior art semiconductor delay circuit device has a plurality of peaks. These peaks of the output signal from the prior art semiconductor delay circuit device include the peaks of the input signal, but other peaks are also included in the output signal. Conversely, as shown in FIG. 20c, an output signal which is delayed and output from the semiconductor delay circuit device of the present invention is nearly equal to the input signal shown in FIG. 20a. Namely, comparing the spectrum of FIG. 20c with that of FIG. 20b, the output signal of the present semiconductor delay circuit device includes few extraneous peaks, since the semiconductor delay circuit device of the present invention has a substrate contact diffusion region which is provided between the source regions of a pair of the same conduction type transistors and has the effect that operation current flowing to one transistor never influences a source potential of the other transistor of the pair transistors which are arranged adjacent to each other and facing each other.

Next, another embodiments of the present invention will be explained. For a better understanding of these preferred embodiments, the problems of the related art will be explained first.

Figure 21:
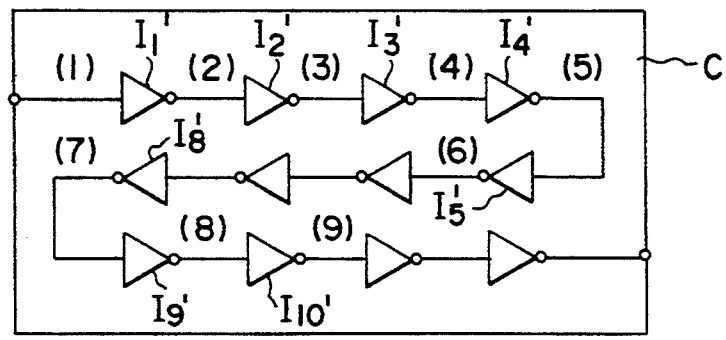
FIG. 21 is a view showing an arrangement of a multistage inverter circuit in a semiconductor delay circuit device according to a prior art.
Figure 22:
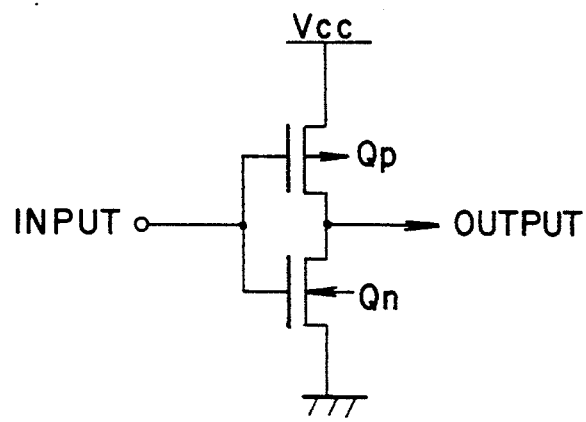
FIG. 22 is a circuit view showing the arrangement of each inverter circuit of FIG. 21.

Generally, to form a semiconductor delay circuit device multiple stages (for instance, 24000 stages) of inverter circuits are arranged on a chip C. As shown in FIG. 21, multiple stages of inverters $I_1'$, $I_2'$, $I_3'$, ... are cascade-connected and sequentially turned to form plural rows. The number of inverter circuits in each row, i.e., the number of stages of each row, is made even. In FIG. 21, for the sake of simplicity, the number of inverter circuits in each row is 4, e.g., the first row, comprises the inverters $I_1'$ to $I_4'$. Each (for example $I_1'$) of the inverters is constituted as a CMOS inverter circuit comprising a P-channel transistor Qp and an N-channel transistor Qn as shown in FIG. 22.

Figure 23:
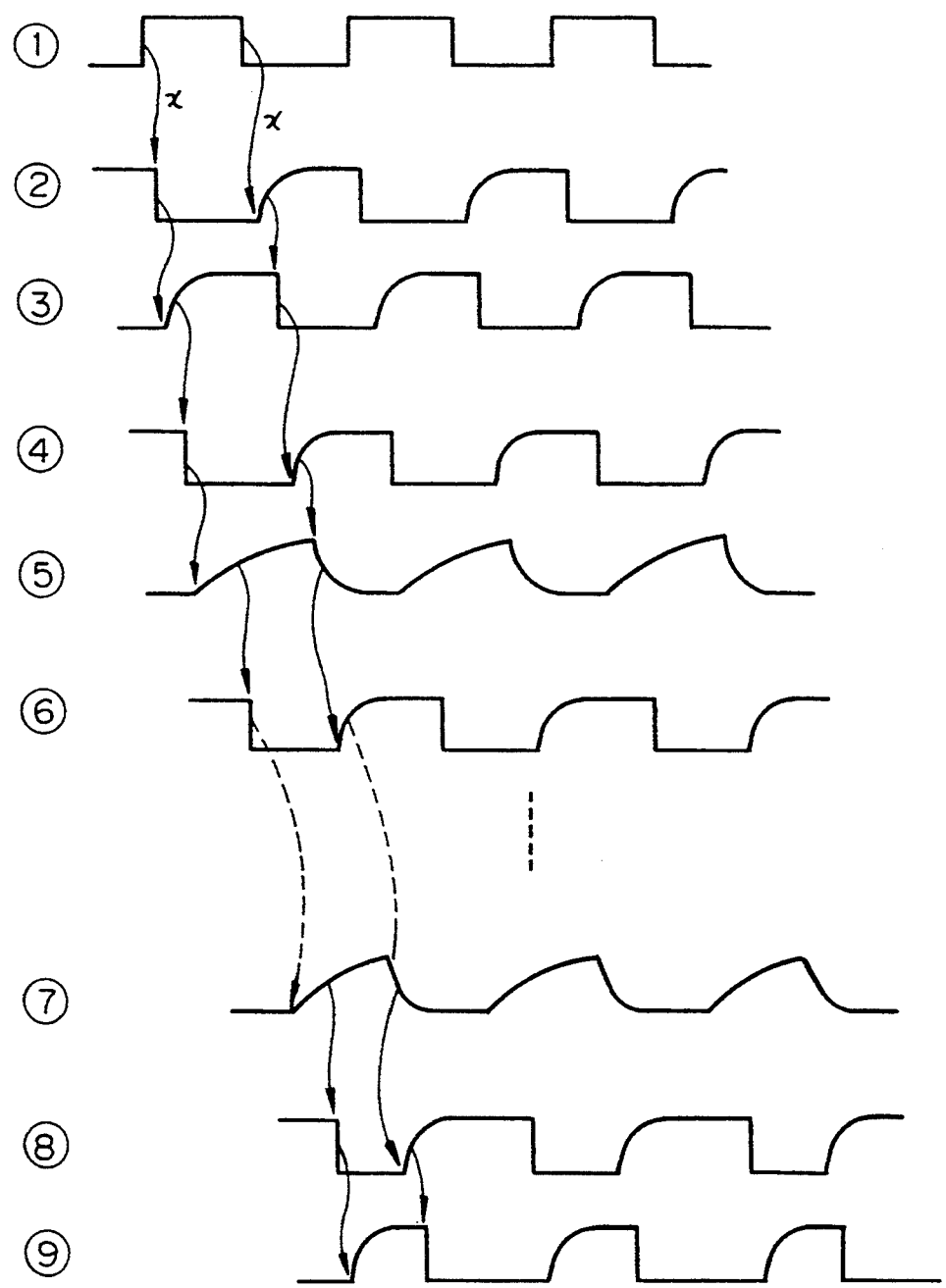
FIG. 23 is a diagram for explaining input and output waveforms of respective points of the multistage inverter circuit of FIG. 21.

FIG. 23 shows changing states of an output signal waveform in each of the multiple stage inverter circuits shown in FIG. 21 when an input signal indicated with ① (a high level portion and a low level portion having the same width, i.e., its duty ratio being 50%) is input into the first stage inverter $I'_1$. Here β (current gain) of the P-channel transistor (inverse proportion to ON resistance of the transistor) of each inverter is supposed to be smaller than β of the N-channel transistor of the inverter. Generally, if the P-channel transistor and N-channel transistor have the same pattern, β of the P-channel transistor is inevitably smaller than β of the N-channel transistor due to the difference of mobility of carriers of the transistors.

First, an output waveform ② of the inverter $I'_1$ is explain. A fall of the same is delayed by a predetermined time t behind a rise of the waveform ① and it abruptly falls at the time. Since β of the P-channel transistor is low, the waveform ② gently rises at a time delayed by the predetermined time t after a fall of the waveform ① so that its rising waveform may be obtuse. Then, an output waveform ③ of the inverter $I_2$ is explained. For the same reason, the waveform gently rises at a time delayed by the predetermined time t after the fall of the waveform ②, and abruptly falls at a time delayed by the predetermined time t behind an intermediate level point of a rise portion of the waveform ②. Accordingly, a duty ratio of the output waveform ③ of the inverter $I_2'$ in the second stage (even stage) again becomes the original duty, ratio. Then, an output waveform ④ of the inverter $I_3'$ is explained. It abruptly falls at a time delayed by the predetermined time t behind an intermediate level point of the rise portion of the waveform ③, and it obtusely rises at a time delayed by the predetermined time t after the fall of the waveform ③. Further an output waveform ⑤ of the inverter $I_4'$ is explained. Since an output wiring of the inverter $I_4'$ is turned and connected to an input of the inverter $I_5'$ of the next row (second row), the length and area thereof may be extended. Therefore, its wiring capacity increases causing a large load so that its rising waveform becomes extremely obtuse and large (its rise time being delayed by t after the fall of the waveform ④). Its falling waveform also becomes slightly obtuse. (Its falling point is delayed by t behind an intermediate level point of the rising portion of the waveform ④.) In this way, compared to the first input waveform ①, the waveform ⑤ largely influences a reduction of duty ratio of a high level side, particularly the rising portion of the waveform ① (i.e. the first cycle of the waveform ①) becomes drastically obtuse. Similarly, an output waveform ⑥ of the inverter $I_5'$ falls at a time delayed by t behind an intermediate level point of the rising portion of the waveform ⑤, and obtusely rises at a time delayed by t behind an intermediate level point of the falling portion of the waveform ⑤. An output waveform ⑦ of last stage inverter $I_8'$ of the second row rises quite obtusely similar to the waveform ⑤ and falls slightly obtusely for the same reason mentioned above, because an output of the inverter $I_8'$ is turned and connected to an input of the inverter $I_9'$. In this way, similar to the waveform ⑤, the rising portion of the first input waveform ① (the first cycle of the waveform ①) becomes quite obtuse, and the waveform ⑦ is affected in a manner similar to that in the waveform ⑤ so that its duty ratio on the high level side may further decrease. In this way, output waveforms ⑧ and ⑨ of inverters $I_9$ and $I_{10}$ in the third row, for example, will be as shown in the figure. As the number of stages increases, the duty ratio gradually changes from the first duty ratio (50%).

As described above, according to the multistage inverter circuit of the prior art, each row contains an even number of inverters, and an output of one row is turned and connected to the next row. An output waveform of the last stage inverter of each row ($I_4'$ or $I_8'$ in the above example) becomes quite obtuse (affected greatly) always on the same side with respect to the signal waveform ① input into the first stage inverter $I_1'$ (i.e., always on the rising side of the above example). Accordingly, as the number of turning rows increases, the duty ratio of an output waveform gradually changes from the duty ratio of the first input waveform ① (causing secondary harmonic distortion). Finally, a problem is caused that a waveform on the high level or low level side almost disappears. The above explanation was given for the case that β of a P-channel transistor is smaller than β of an N-channel transistor in each inverter. If β of the P-channel transistor is larger than β of the N-channel transistor, for example, a layout pattern of the P-channel transistor is larger than a layout pattern of the N-channel transistor, an output waveform of the last stage inverter of each row is greatly affected always on the same side (on the falling side in this case with respect to the signal waveform ① input into the first stage inverter $I_1'$, thus causing the same problem as above.

Below, an example of a semiconductor delay circuit device of the present embodiment will be explained with reference to FIGS. 24 to 26.

Figure 24A:
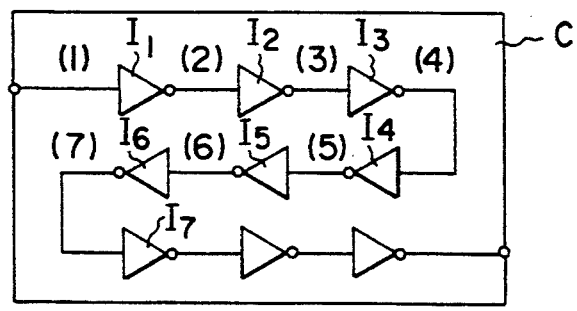
FIG. 24A is a view showing an arrangement of a multistage inverter circuit in a semiconductor delay circuit device as a variation of the embodiments according to the present invention.
Figure 24B:
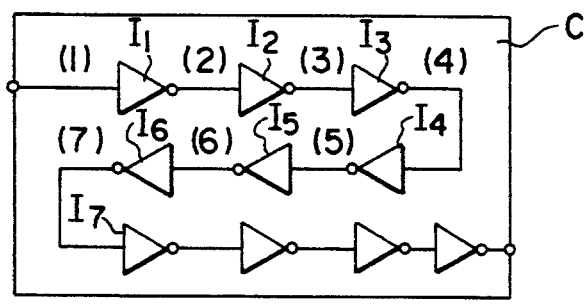
FIG. 24B shows a series of inverters having an odd number of stage of inverters in each row, except for an even number in the last row.

FIG. 24 shows a semiconductor delay circuit device having multistage inverter circuits on a chip C according to an embodiment of the present invention. In FIG. 24, the multistage inverter circuits are sequentially turned (two times) to form three rows, and are cascade-connected. The number of inverter circuits in each row is made odd (three in this case). As shown in FIG. 22 each inverter is constituted as a CMOS inverter circuit comprising a P-channel transistor and an N-channel transistor.

Figure 25:
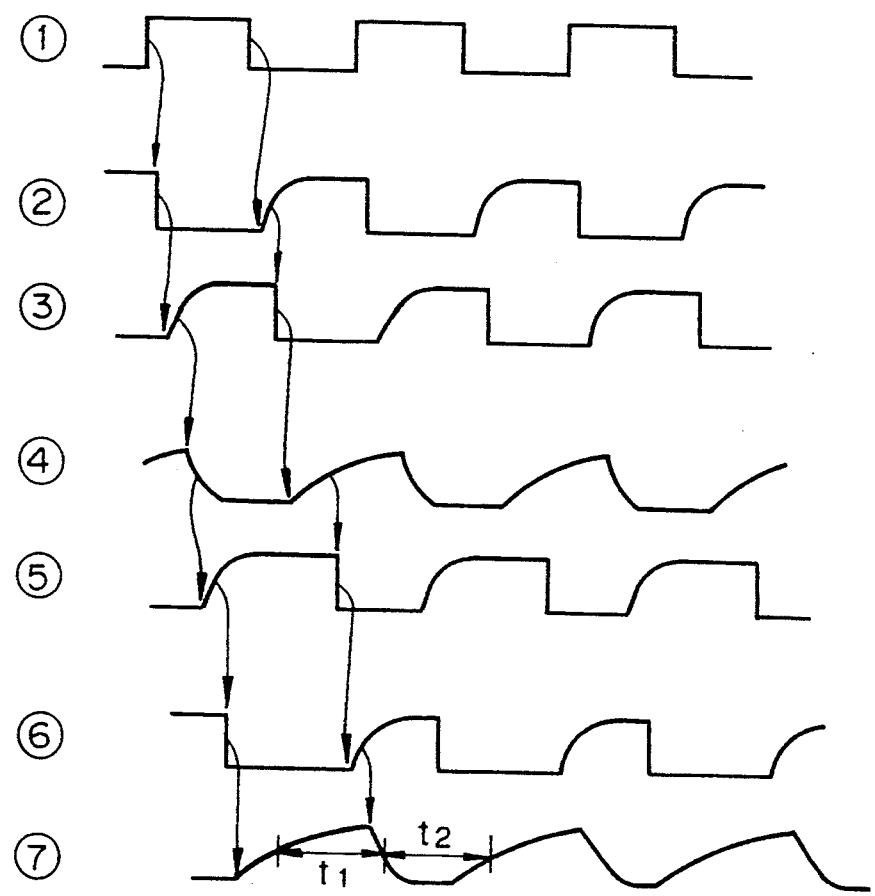
FIG. 25 is a diagram for explaining input and output waveforms of respective points of the multistage inverter circuit of FIG. 24.

FIG. 25 shows waveforms of respective portions of the multistage inverter circuits shown in FIG. 24. Similar to the case of FIG. 23, ①  indicates an input signal waveform with a duty ratio of 50% input in a first stage inverter $I_1$. In each inverter, it is supposed that $\beta$ of the P-channel transistor is smaller than $\beta$ of the N-channel transistor.

Consequently, an output waveform ② of the inverter $I_1$ and an output waveform ③ will be the same as those of FIG. 23. Since the output wiring of an inverter $I_3$ in the last stage of the first row is turned and connected to the input of an inverter $I_4$ of the next row (second row), an output waveform ④ of the inverter $I_3$ rises quite obtusely and falls slightly obtusely for the same reasons explained with reference to FIG. 23. In this case, its rising point is delayed by a time t behind a falling point of the waveform ③, and its falling point is delayed by t behind an intermediate level point of a rising portion of the waveform ③. In this way, with respect to the first input waveform ①, the waveform ④ causes a variation in the duty ratio (a reduction of the duty ratio on the high level side) because the falling portion of the waveform ① (i.e., the second cycle of the waveform ①) becomes quite obtuse. Similarly, output wave forms ⑤ and ⑥ of inverters $I_4$ and $I_5$ in the second row are sequentially delayed by the predetermined time t to become those shown in FIG. 25. Since the output of an inverter $I_6$ in the last stage of the second row is turned and connected to the input of an inverter $I_7$ of the next row (third row), an output waveform ⑦ of the inverter $I_6$ rises quite obtusely and falls slightly obtusely for the same reasons mentioned above. Contrary to the waveform ④, with respect to the first input waveform ①, the rising portion of the waveform ① (i.e., the first cycle of the waveform ①) becomes greatly obtuse in the waveform ⑦ to compensate a variation in the duty ratio in the waveform ④. In this way, by sequentially turning and connecting the inverters an even number of times, and by making the number of stages of inverters in each row (except the last row) odd, an output waveform of the last stage inverter in each row with respect to the first input waveform ① becomes such that portions corresponding to the falling and rising portions of the waveform ① are alternately affected with the same influence. A duty ratio of an output waveform of the last stage inverter (for example $I_6$) in an even row whose output side is connected to a turned wiring is always equal to the duty ratio of the first input waveform ① (50% in this case). For example, the duty ratio of the waveform ⑦ will be 50%, i.e., ($t_1 = t_2$), at each intermediate level point. Since an output waveform of each inverter in the last row (third row in this case) rises obtusely at a slight degree, a duty ratio of the output waveform of the odd inverter may slightly differ from the duty ratio of the input waveform ①. However, at an output waveform of the next even stage inverter, its duty ratio returns to the original one. Unlike the conventional circuit shown in FIG. 23, the duty ratio does not gradually change as the number of stages of inverters than are sequentially turned and connected in plural rows increases.

In the above-described embodiment, $\beta$ of the P-channel transistor was smaller than $\beta$ of the N-channel transistor in each inverter. However, even if $\beta$ of the P-channel transistor is larger than $\beta$ of the N-channel transistor, the same effect as mentioned above will be provided.

Figure 26:
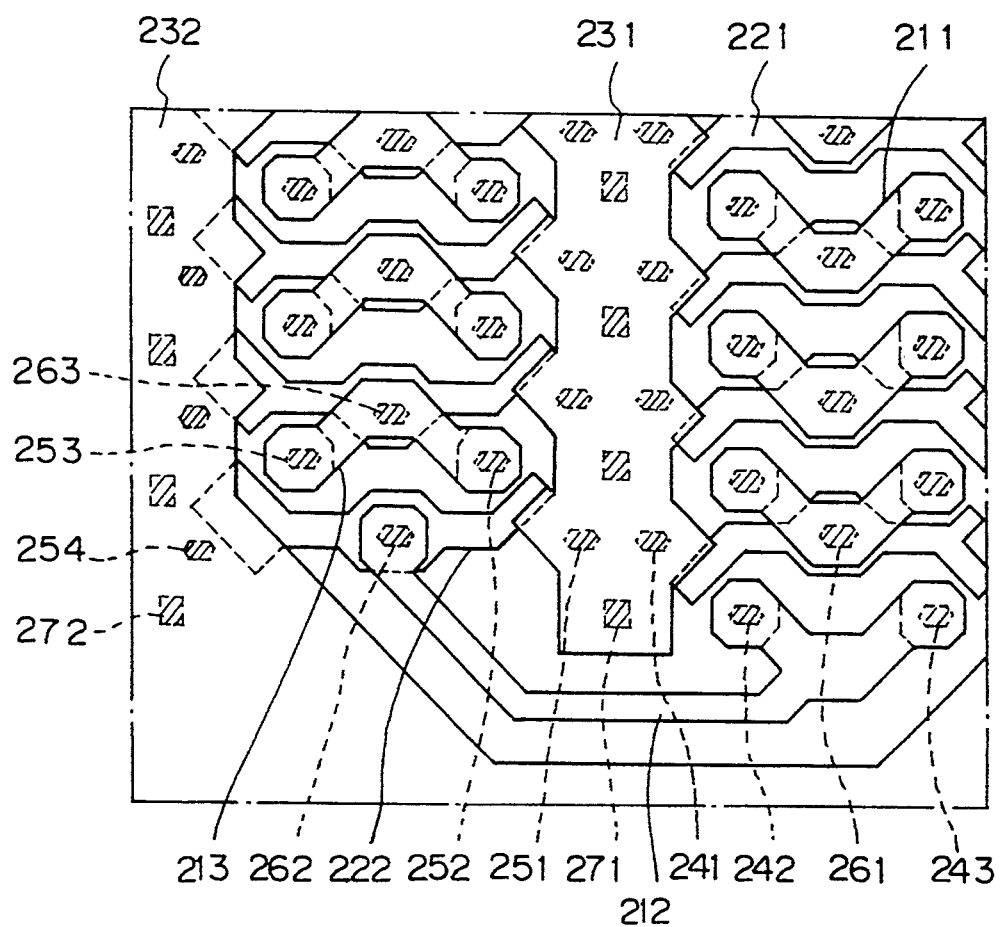
FIG. 26 is a plan view showing an arrangement of a part of the multistage inverter circuit shown in FIG. 24.

FIG. 26 shows a layout pattern of wiring to a next stage inverter in the multistage inverter circuits shown in FIG. 24. In FIG. 26, V-shape wiring (indicated with a numeral 211) shown in the right row is aluminum wiring for connecting two adjacent inverters in the above-mentioned first row, for example, with each other (i.e., connecting an output of the previous stage inverter with an input of the next stage inverter). Numeral 212 is aluminum wiring having a turning portion for connecting, for example, an output of the last stage inverter of the first row with an input of the first stage inverter of the second row. Numeral 213 is aluminum wiring for connecting, for example, two adjacent inverter in the second row with each other. Namely, the wiring length and layout area of the aluminum wiring 212 having the turning portion (corresponding to turning wiring for connecting the inverters $I_3$ and $I_4$ or $I_6$ and $I_7$ of the adjacent rows) become larger than those of the aluminum wirings 211 and 213 for connecting inverters of the same row, as shown in FIG. 26.

In FIG. 26, numerals 221 and 222 are polysilicon layers having gate electrodes of P-channel and N-channel transistors constituting each inverter; 231 is aluminum wiring for power source connection disposed on the source region side of P-channel transistor of each inverter; 232 is aluminum wiring for power source connection disposed on the source region side of N-channel transistor of each inverter; 241 and 251 are contacts for connecting source regions of P-channel transistors of respective inverters with the aluminum wiring 231; 242 and 252 are contacts for connecting drain regions of P-channel transistors of respective inverters with the aluminum wiring 211, 212 or 213; 243 and 253 are contacts for connecting drain regions of N-channel transistors of respective inverters with the aluminum wiring 211, 212 or 213, 254 is a contact for connecting the source region of N-channel transistor of each inverter with the aluminum wiring 232; 261, 262 and 263 are contacts for connecting the aluminum wiring 211, 212 or 213 (i.e., the output side of an inverter of previous stage) with an input side (polysilicon layer 221 or 222) of the next stage inverter; 271 is a contact for connecting a substrate contact diffusion region disposed on the source region side of P-channel transistor of each inverter with the aluminum wiring 231; and 272 is a contact for connecting a substrate contact diffusion region disposed on the source region side of the N-channel transistor of each inverter with the aluminum wiring 232.

According to the present embodiment, even if inverter circuits in each of which $\beta$ of the P-channel transistor and N-channel transistor differ from each other are connected in plural rows and in plural stages, a duty ratio of an output waveform of the last stage inverter may be substantially equal to a duty ratio of a signal waveform input in the first stage inverter.

Many widely different embodiments of the present invention may be constructed without departing from the spirit and scope of the present invention, and it should be understood that the present invention is not limited to the specific embodiments described in this specification, except as defined in the appended claims.

While the invention has been particularly shown and described in reference to preferred embodiments thereof, it will be understood by those skilled in the art that changes in form and details may be made therein without departing from the spirit and scope of the invention.

We claim:

1. A semiconductor integrated circuit device comprising multiple stages of pairs of transistors of the first conduction type, wherein each transistor in each of said pairs of transistors has a separate source region, said separate source regions of each of said pairs of transistors receiving a common power supply voltage, said separate source regions of each of said pairs of transistors being arranged adjacent to each other in a channel length direction and facing each other in a channel length direction; and a substrate contact diffusion region having a second conduction type which is opposite to that of said separate source regions, said substrate contact diffusion region extending between said separate source regions of each of said pairs of transistors and between respective separate source regions of said pairs of transistors in adjacent stages, said substrate contact diffusion region extending to separate source regions of said pairs of transistors in adjacent stages and protruding towards channel forming regions of each of said pairs of transistors arranged in multiple stages having separate source regions.

2. A semiconductor integrated circuit device according to claim 1, wherein said substrate contact diffusion region has a higher impurity density than one of a well and a substrate.

3. A semiconductor integrated circuit device according to claim 1, wherein said substrate contact diffusion region between the separate source regions of each of said pairs of transistors includes a contact portion for connecting aluminum wiring.

4. A semiconductor integrated circuit device according to claim 1, wherein the distance of the substrate contact diffusion region between the separate source regions of each of said pair of transistors is less than 4 microns.

5. A semiconductor integrated circuit device comprising:
a first power supply line;
a second power supply line; and
a plurality of inverter circuits being cascade-connected and each of said inverter circuits being connected to said first and second power supply lines, each of said inverter circuits being constituted by a first conduction type transistor and a second conduction type transistor, and a pair of transistors of the first conduction type each having a separate source region, said transistors of said pair of transistors are formed in two different inverter rows, wherein separate source regions of said pair of transistors of the first conduction type are connected to said first power supply line, the respective separate source regions of said pair of transistors of the first conduction type being arranged adjacent to each other in a channel length direction and facing each other in a channel length direction, and a substrate contact diffusion region having a second conduction type which is opposite to that of the separate source regions extends between said separate source regions of said pair of transistors of the first conduction type.

6. A semiconductor integrated circuit device according to claim 5, wherein said substrate contact diffusion region has a higher impurity density than a substrate.

7. A semiconductor integrated circuit device according to claim 5, wherein said first conduction type transistor is a P-channel type transistor and said second conduction type transistor is an N-channel type transistor, and said first power supply line is used for applying a high potential power supply to a source region of each P-channel type transistor of said inverter circuits and said second power supply line is used for applying a low potential power supply to a source region of each N-channel type transistor of said inverter circuits.

8. A semiconductor integrated circuit device according to claim 5, wherein said substrate contact diffusion region between the separate source regions of said pair of transistor of the first conduction type includes a contact portion for connecting aluminum wiring.

9. A semiconductor integrated circuit device according to claim 5, wherein the distance of the substrate contact diffusion region between the separate source regions of said pair of transistors of the first conduction type is less than 4 microns.

10. A semiconductor integrated circuit device according to claim 5, wherein said plurality of inverter circuits are arranged in plural rows, sequentially turned an even number of times and cascade-connected, the number of stages of the inverter circuits in each row being odd.

11. A semiconductor integrated circuit device according to claim 10, wherein an ON resistance value of said first conduction type transistor differs from that of said second conduction type transistor.

12. A semiconductor integrated circuit device according to claim 5, wherein said plurality of inverter circuits are arranged in a plurality of rows, sequentially turned an even number of times and cascade-connected, the number of stages of the inverter circuits in each row except the last row being odd and the last row being even.

13. A semiconductor integrated circuit device comprising:
a first power supply line;
a second power supply line; and
a plurality of inverter circuits arranged in at least two inverter rows by connecting an output of one of said inverter circuits and an input of an adjacent one of said inverter circuits, said inverter rows being adjacently arranged, said inverter circuits being cascade-connected and each of said inverter circuits being connected to said first and second power supply lines, each of said inverter circuits being constituted by a first conduction type transistor and a second conduction type transistor, a pair of transistors of the first conduction type each having a separate source region, said transistors of said pair of transistors are formed in two different inverter rows, the separate source regions of said pair of transistors being arranged adjacent to each other in a channel length direction and facing each other in a channel length direction, said first conduction type transistor of each inverter circuit having a source region which is separate from a source region of said second conduction type transistor of each inverter circuit, source and drain regions of each of said first and second conduction type transistors of each inverter circuit being arranged so that conductive wiring layers connecting the respective source and drain regions of each of said first and second conduction type transistors of each inverter circuit intersect each other, and a first conductive layer having gate electrodes is disposed on the source and drain regions of each of said first and second conduction type transistors of one of the inverter circuits, one of the gate electrodes of the first conductive layer is orthogonal to one of said conductive wiring layers which connected to the drain regions of the first and second conduction type transistors of the inverter circuits.

14. A semiconductor integrated circuit device according to claim 13, wherein a plan shape of a wiring contact provide for each of the source and drain regions of said first and second conduction type transistors is hexagonal.

15. A semiconductor integrated circuit device according to claim 13, wherein said one of said conductive wiring layers for connecting the drain regions of said first and second conduction type transistors of said one of the inverter circuits with each other is connected to a second conductive layer having respective gate electrodes of a next stage inverter circuit.

16. A semiconductor integrated circuit device according to claim 13, wherein said plurality of inverter circuits are arranged in plural rows, sequentially turned an even number of times and cascade-connected, the number of stages of the inverter circuits in each row being odd.

17. A semiconductor integrated circuit device according to claim 16, wherein an ON resistance value of said first conduction type transistor differs from that of said second conduction type transistor.

18. A semiconductor integrated circuit device according to claim 13, wherein said plurality of inverter circuits are arranged in a plurality of rows, sequentially turned an even number of times and cascade-connected, the number of stages of the inverter circuits in each row except the last row being odd and the last row being even.

19. A semiconductor integrated circuit device according to claim 13, wherein said one of said conductive wiring layers for connecting the drain regions of said first and second conduction type transistors of said one of the inverter circuits with each other has a curved portion opposite to a curved portion of the first conductive layer having the gate electrodes of said first and second conduction type transistors of said one of the inverter circuits.

* * * * *